(12) United States Patent
Seo

(10) Patent No.: US 9,614,068 B2
(45) Date of Patent: Apr. 4, 2017

(54) SEMICONDUCTOR DEVICE AND METHOD OF FABRICATING THE SAME

(71) Applicant: SAMSUNG ELECTRONICS CO., LTD., Suwon-si, Gyeonggi-Do (KR)

(72) Inventor: Kang-Ill Seo, Chungcheongbuk-Do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/843,231

(22) Filed: Sep. 2, 2015

(65) Prior Publication Data

US 2017/0062598 A1 Mar. 2, 2017

(51) Int. Cl.
*H01L 29/06* (2006.01)
*H01L 29/775* (2006.01)
*H01L 29/423* (2006.01)
*H01L 29/786* (2006.01)

(52) U.S. Cl.
CPC ........ *H01L 29/775* (2013.01); *H01L 29/0669* (2013.01); *H01L 29/42392* (2013.01); *H01L 29/78696* (2013.01)

(58) Field of Classification Search
CPC ............. H01L 29/42392; H01L 29/775; H01L 29/0665; H01L 29/0669
See application file for complete search history.

(56) References Cited

U.S. PATENT DOCUMENTS

| | | | |
|---|---|---|---|
| 5,965,914 A | 10/1999 | Miyamoto | |
| 7,608,893 B2 | 10/2009 | Orlowski | |
| 7,719,038 B2 | 5/2010 | Kim | |
| 8,017,479 B2 | 9/2011 | Kim | |
| 8,022,439 B2* | 9/2011 | Kajiyama | B82Y 10/00 257/192 |
| 8,084,308 B2 | 12/2011 | Chang et al. | |
| 8,110,471 B2* | 2/2012 | Lee | B82Y 10/00 257/E29.127 |
| 8,367,487 B2 | 2/2013 | Ernst et al. | |
| 8,399,879 B2* | 3/2013 | Liu | B82Y 10/00 257/24 |
| 8,445,348 B1 | 5/2013 | Kuo et al. | |

(Continued)

FOREIGN PATENT DOCUMENTS

| | | |
|---|---|---|
| JP | 5532071 | 5/2014 |
| KR | 10-0306178 | 8/2001 |

(Continued)

*Primary Examiner* — John C Ingham
(74) *Attorney, Agent, or Firm* — F. Chau & Associates, LLC

(57) ABSTRACT

A semiconductor device includes a first active region, a field insulating layer disposed in the first active region, a first nanowire pattern disposed on the first active region and extended in a first direction, and a first gate disposed on the first active region and extended in a second direction crossing the first direction. The first gate covers the first nanowire pattern. The semiconductor device further includes a source or drain epitaxial layer disposed on at least one side of the first nanowire pattern. The first gate includes a first region disposed on the first nanowire pattern and having a first width, and a second region disposed beneath the first nanowire pattern and having a second width wider than the first width.

20 Claims, 30 Drawing Sheets

(56) References Cited

U.S. PATENT DOCUMENTS

| | | | |
|---|---|---|---|
| 8,492,232 B2* | 7/2013 | Ernst | H01L 29/42392 |
| | | | 257/E21.409 |
| 8,753,942 B2 | 6/2014 | Kuhn et al. | |
| 8,796,742 B1* | 8/2014 | Chang | H01L 29/42392 |
| | | | 257/213 |
| 8,835,231 B2* | 9/2014 | Bangsaruntip | B82Y 10/00 |
| | | | 257/E21.409 |
| 8,946,789 B2 | 2/2015 | Kim et al. | |
| 2006/0240622 A1 | 10/2006 | Lee et al. | |
| 2014/0225065 A1* | 8/2014 | Rachmady | H01L 29/42392 |
| | | | 257/24 |
| 2014/0239255 A1 | 8/2014 | Kang et al. | |

FOREIGN PATENT DOCUMENTS

| | | |
|---|---|---|
| KR | 1020060110702 | 10/2006 |
| KR | 100827529 | 4/2008 |
| KR | 1020120100630 | 9/2012 |

* cited by examiner

SEMICONDUCTOR DEVICE AND METHOD OF FABRICATING THE SAME

TECHNICAL FIELD

Exemplary embodiments of the present inventive concept relate to a semiconductor device and a method of fabricating the same.

DISCUSSION OF THE RELATED ART

In a semiconductor device having a stacked nanosheet transistor structure, a gate-all-around structure is a scaling technique capable of improving the integration density of the semiconductor device. The gate-all-around structure can be made, for example, by forming a nanowire-shaped silicon body on a substrate and forming a gate surrounding the silicon body.

SUMMARY

Exemplary embodiments of the present inventive concept provide a semiconductor device in which leakage current between sources and drains is reduced.

According to an exemplary embodiment of the present inventive concept, a semiconductor device includes a first active region, a field insulating layer disposed in the first active region, a first nanowire pattern disposed on the first active region and extended in a first direction, and a first gate disposed on the first active region and extended in a second direction crossing the first direction. The first gate covers the first nanowire pattern. The semiconductor device further includes a source or drain epitaxial layer disposed on at least one side of the first nanowire pattern. The first gate includes a first region disposed on the first nanowire pattern and having a first width, and a second region disposed beneath the first nanowire pattern and having a second width wider than the first width.

According to an exemplary embodiment of the present inventive concept, a semiconductor device includes a first active region, a field insulating layer disposed in the first active region, a first nanowire pattern disposed on the first active region and extended in a first direction, and a first gate disposed on the first active region and extended in a second direction crossing the first direction. The first gate covers the first nanowire pattern. The semiconductor device further includes a first source or drain impurity layer disposed in the first active region, and a first source or drain epitaxial layer disposed on at least one side of the first nanowire pattern. The first source or drain epitaxial layer includes an upper region having a first width and a lower region having a second width narrower than the first width.

According to an exemplary embodiment of the present inventive concept, a semiconductor device includes a first active region, a field insulating layer disposed in the first active region, a first nanowire pattern disposed on and spaced apart from the first active region and extended in a first direction, a second nanowire pattern disposed on and spaced apart from the first active region, spaced apart from the first nanowire pattern, and extended in the first direction, and a first gate disposed on the first active region and extended in a second direction crossing the first direction. The first gate entirely surrounds a perimeter of the first and second nanowire patterns. The semiconductor device further includes a source or drain epitaxial layer disposed on at least one side of the first and second nanowire patterns. The first gate includes a first region disposed on the first nanowire pattern and having a first width, and a second region disposed beneath the first nanowire pattern and having a second width wider than the first width.

DETAILED DESCRIPTION OF THE EXEMPLARY EMBODIMENTS

Figure 1:
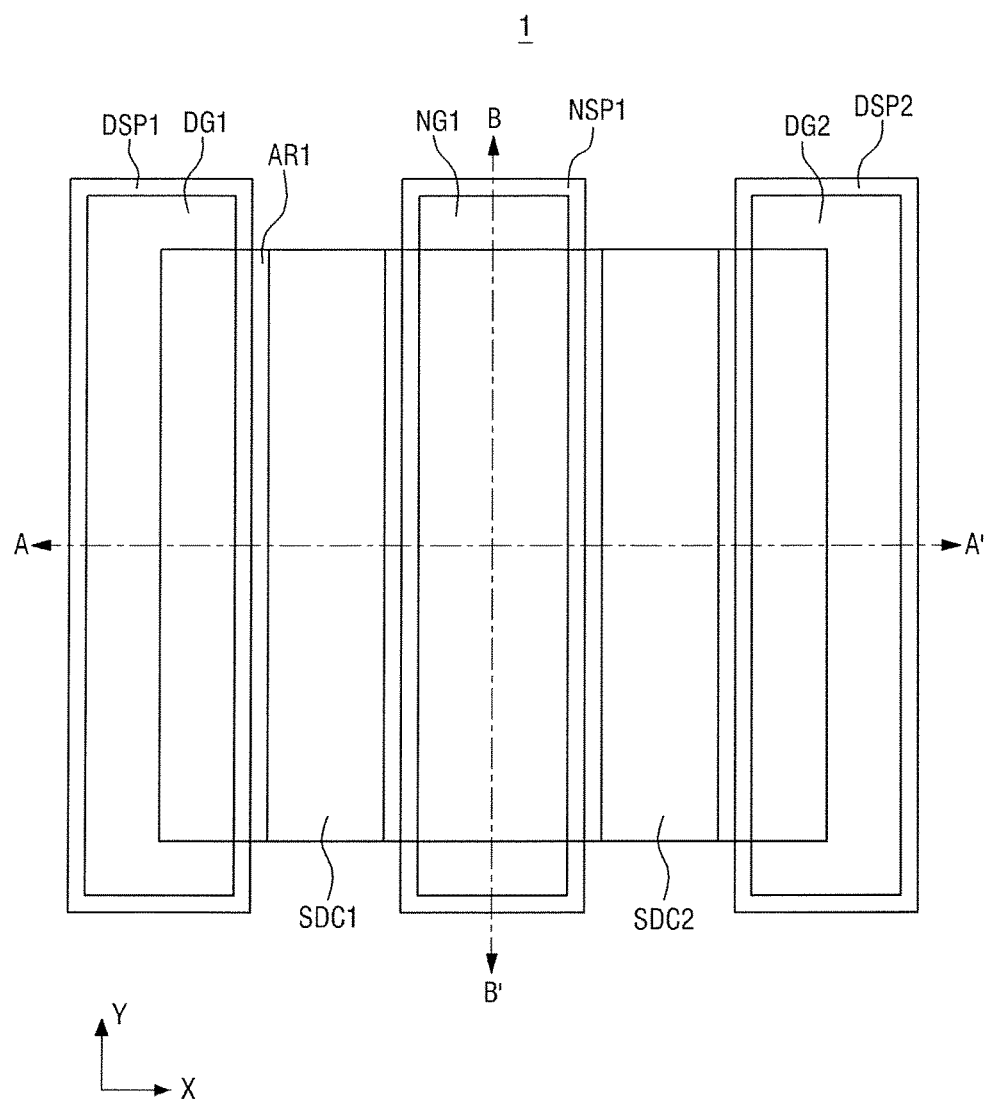
FIG. 1 is a top view of a semiconductor device according to an exemplary embodiment of the present inventive concept.

Exemplary embodiments of the present inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when an element or layer is referred to as being "on," "connected to", or "covered by" another element or layer, it can be directly on, connected to, or covered by the other element or layer or intervening elements or layers may be present. In addition, it will also be understood that when an element or layer is referred to as being "between" two elements or layers, it can be the only element or layer between the two elements or layers, or one or more intervening elements or layers may also be present. As used herein, the term "and/or" includes any and all combinations of one or more of the associated listed items. Further, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross-sectional views, and/or plan views, in which exemplary embodiments of the inventive concept are shown. Thus, the profile of an exemplary view may be modified according to manufacturing techniques and/or allowances. That is, the exemplary embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor device according to an exemplary embodiment of the present inventive concept will be described with reference to FIGS. 1 to 3.

FIG. 1 is a top view of a semiconductor device according to an exemplary embodiment of the present inventive concept. FIG. 2 is a cross-sectional view taken along line A-A' of FIG. 1 according to an exemplary embodiment of the present inventive concept. FIG. 3 is a cross-sectional view taken along line B-B' of FIG. 1 according to an exemplary embodiment of the present inventive concept.

Figure 2:
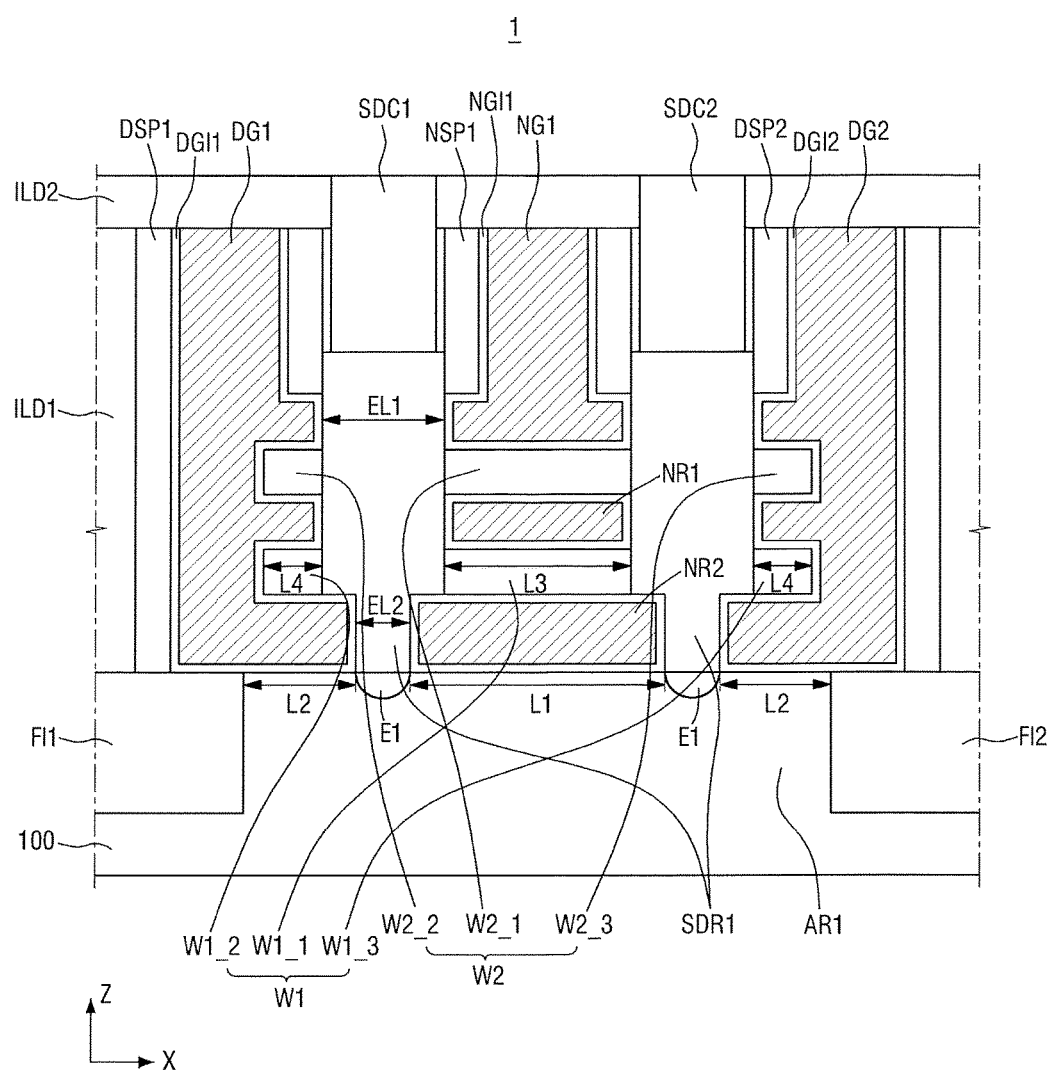
FIG. 2 is a cross-sectional view taken along line A-A' of FIG. 1 according to an exemplary embodiment of the present inventive concept.

For clarity, first and second interlayer insulating layers ILD1 and ILD2, first and second dummy gate insulating layers DGI1 and DGI2, and a first gate insulating layer NGI1 shown in FIG. 2 are omitted in FIG. 1.

Figure 3:
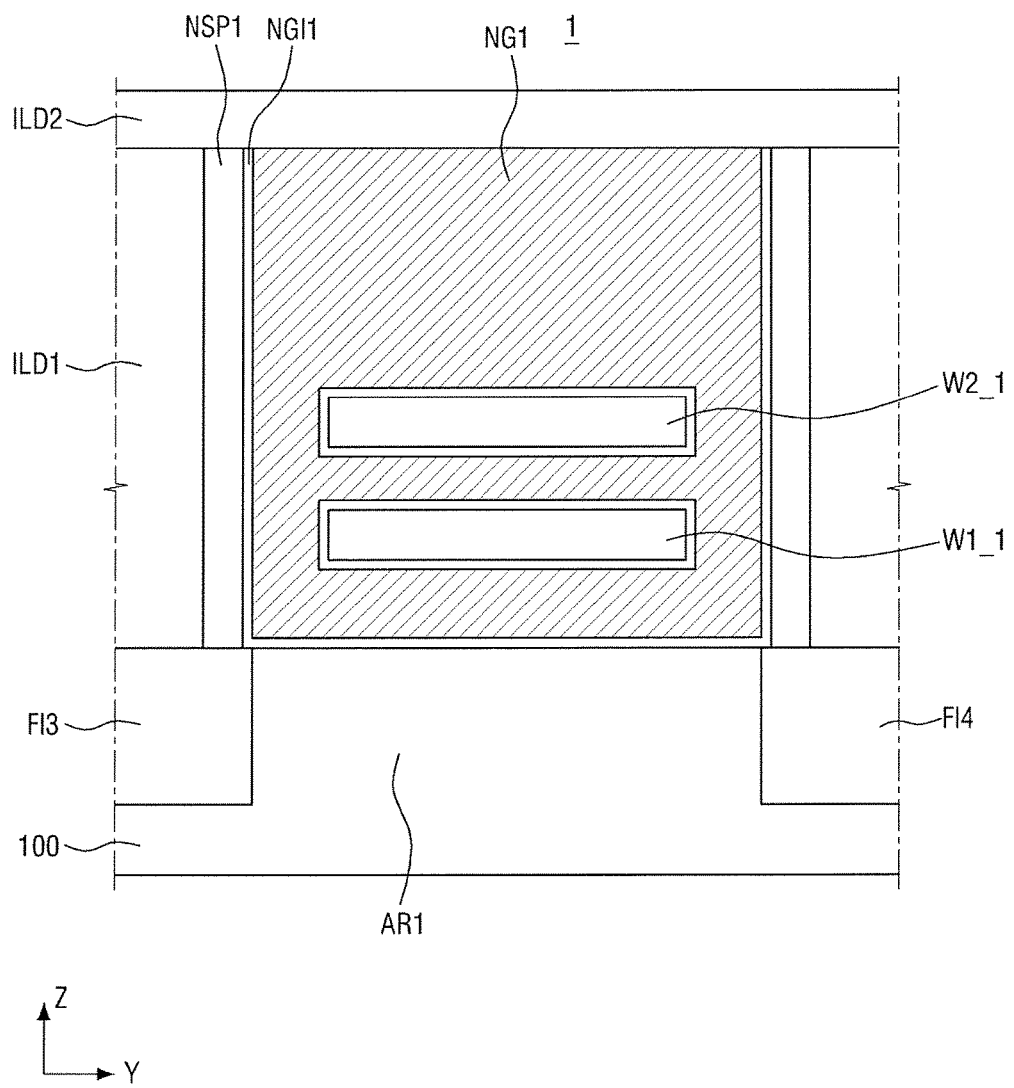
FIG. 3 is a cross-sectional view taken along line B-B' of FIG. 1 according to an exemplary embodiment of the present inventive concept.

Referring to FIGS. 1 to 3, a semiconductor device 1 includes a substrate 100, a first nanowire pattern W1, a second nanowire pattern W2, a first gate NG1, first and second dummy gates DG1 and DG2, a first gate spacer NSP1, first and second dummy gate spacers DSP1 and DSP2, a first gate insulating layer NGI1, first and second dummy gate insulating layers DGI1 and DGI2, a first source or drain epitaxial layer SDR1, a first source or drain impurity layer E1, first and second interlayer insulating layers ILD1 and ILD2 and first to fourth field insulating layers FI1 to FI4. Herein, the term "source or drain impurity layer" indicates that the layer may correspond to either a source or a drain.

Although the semiconductor device 1 according to an exemplary embodiment of the present inventive concept as shown in FIG. 2 includes first and second nanowire patterns W1 and W2, exemplary embodiments are not limited thereto. That is, the semiconductor device 1 may include one nanowire pattern, or three or more nanowire patterns.

The substrate 100 may be, for example, bulk silicon. Alternatively, the substrate 100 may be a silicon substrate, or may include other materials such as, for example, silicon germanium, indium antimonide, lead telluride, indium arsenide, indium phosphide, gallium arsenide or gallium antimonide. Alternatively, the substrate 100 may be formed by disposing an epitaxial layer on a base. However, exemplary embodiments of the present inventive concept are not limited thereto.

Further, the substrate 100 may include a first active region AR1. The first active region AR1 may protrude from the substrate 100, and the first active region AR1 may include, for example, the same material as that of the substrate 100.

The first nanowire pattern W1 may extend in a first direction X on the first active region AR1. Herein, when a nanowire pattern, such as the first nanowire pattern W1, is described as extending in the first direction X, it is understood that the longest lengthwise portion of the nanowire pattern extends in the first direction. In addition, the first nanowire pattern W1 may include a part W1_1 which is covered (e.g., entirely covered) by the first gate NG1, and parts W1_2 and W1_3 which are covered (e.g., entirely covered) by the first and second dummy gates DG1 and DG2.

In an exemplary embodiment, the width of a region in the first direction X in which the first active region AR1 and the first gate NG1 are overlapped with each other is a first width L1, and the width of a region in the first direction X in which the first active region AR1 and the first and second dummy gates DG1 and DG2 are overlapped with each other is a second width L2. The first width L1 and the second width L2 may be different from each other.

The width of the part W1_1 in the first direction X in which the first nanowire pattern W1 is covered (e.g., entirely covered) by the first gate NG1 is a third width L3, and the width of the parts W1_2 and W1_3 in the first direction X in which the first nanowire pattern W1 is covered by the first and second dummy gates DG1 and DG2 is a fourth width L4. The third width L3 and the fourth width L4 may be different from each other. In this case, unlike the first gate NG1, the first and second dummy gates DG1 and DG2 may cover (e.g., entirely cover) both ends of the first nanowire pattern W1, respectively.

That is, the first nanowire pattern W1 may penetrate through a part of each of the first and second dummy gates DG1 and DG2, and the first dummy gate DG1 may cover (e.g., entirely cover) one end of the first nanowire pattern W1 and the second dummy gate DG2 may cover (e.g., entirely cover) the other end of the first nanowire pattern W1. In this case, the expression "the first nanowire pattern W1 may penetrate through a part of each of the first and second dummy gates DG1 and DG2" refers to the first nanowire pattern W1 having reached a predetermined point inside the first and second dummy gates DG1 and DG2.

Furthermore, the part W1_1 in which the first nanowire pattern W1 is covered (e.g., entirely covered) by the first gate NG1 may be surrounded by the first source or drain epitaxial layer SDR1 and the first gate insulating layer NGI1. The parts W1_2 and W1_3 in which the first nanowire pattern W1 is covered (e.g., entirely covered) by the first and second dummy gates DG1 and DG2 may be surrounded by the first source or drain epitaxial layer SDR1 and the first and second dummy gate insulating layers DCI1 and DGI2.

The first width L1 may be wider than the third width L3, and the second width L2 may be wider than the fourth width L4.

For example, the width of the region in the first direction X in which the first active region AR1 and the first gate NG1 are overlapped with each other may be wider than the width of the region in the first direction X in which the first nanowire pattern W1 and the first gate NG1 are overlapped with each other. Furthermore, the width of the region in the first direction X in which the first active region AR1 and the first and second dummy gates DG1 and DG2 are overlapped with each other may be wider than the width of the region in the first direction X in which the first nanowire pattern W1 and the first and second dummy gates DG1 and DG2 are overlapped with each other.

That is, a part of the region in which the first active region AR1 and the first gate NG1 are overlapped with each other may be overlapped with the first nanowire pattern W1, and the rest of the region may be overlapped with one end of the first source or drain epitaxial layer SDR1.

Furthermore, a part of the region in which the first active region AR1 and the first and second dummy gates DG1 and DG2 are overlapped with each other may be overlapped with the first nanowire pattern W1, and the rest of the region may be overlapped with the other end of the first source or drain epitaxial layer SDR1.

The second nanowire pattern W2 may extend in a first direction X1 on the first active region AR1. That is, the second nanowire pattern W2 may be disposed on the first nanowire pattern W1. Furthermore, the second nanowire pattern W2 may include a part W2_1 covered (e.g., entirely covered) by the first gate NG1 and parts W2_2 and W2_3 covered (e.g., entirely covered) by the first and second dummy gates DG1 and DG2.

The third width L3 is the width of the part W2_1 in the first direction X in which the second nanowire pattern W2 is covered (e.g., entirely covered) by the first gate NG1, and the fourth width L4 is the width of the parts W2_2 and W2_3 in the first direction X in which the second nanowire pattern W2 is covered (e.g., entirely covered) by the first and second dummy gates DG1 and DG2. The third width L3 and the fourth width L4 may be different from each other. In this case, unlike the first gate NG1, the first and second dummy gates DG1 and DG2 may cover (e.g., entirely cover) both ends of the second nanowire pattern W2, respectively.

That is, the second nanowire pattern W2 may penetrate through a part of each of the first and second dummy gates DG1 and DG2, the first dummy gate DG1 may cover (e.g., entirely cover) one end of the second nanowire pattern W2, and the second dummy gate DG2 may cover (e.g., entirely cover) the other end of the second nanowire pattern W2. In this case, the expression "the second nanowire pattern W2 may penetrate through a part of each of the first and second dummy gates DG1 and DG2" refers to the second nanowire pattern W2 having reached a predetermined point inside the first and second dummy gates DG1 and DG2.

Furthermore, the part W2_1 in which the second nanowire pattern W2 is covered (e.g., entirely covered) by the first gate NG1 may be surrounded by the first source or drain epitaxial layer SDR1 and the first gate insulating layer NGI1. The parts W2_2 and W2_3 in which the second nanowire pattern W2 is covered (e.g., entirely covered) by the first and second dummy gates DG1 and DG2 may be surrounded by the first source or drain epitaxial layer SDR1 and the first and second dummy gate insulating layers DGI1 and DGI2.

The width of the region in the first direction X in which the first active region AR1 and the first gate NG1 are overlapped with each other may be wider than the width of the region in the first direction X in which the second nanowire pattern W2 and the first gate NG1 are overlapped with each other. Furthermore, the width of the region in the first direction X in which the first active region AR1 and the first and second dummy gates DG1 and DG2 are overlapped with each other may be wider than the width of the region in the first direction X in which the second nanowire pattern W2 and the first and second dummy gates DG1 and DG2 are overlapped with each other.

That is, a part of the region in which the first active region AR1 and the first gate NG1 are overlapped with each other may be overlapped with the second nanowire pattern W2, and the rest of the region may be overlapped with one end of the first source or drain epitaxial layer SDR1.

Furthermore, a part of the region in which the first active region AR1 and the first and second dummy gates DG1 and DG2 are overlapped with each other may be overlapped with the second nanowire pattern W2, and the rest of the region may be overlapped with the other end of the first source or drain epitaxial layer SDR1.

The width of the second nanowire pattern W2 and the width of the first nanowire pattern W1 may be substantially the same as each other in the first direction X. Furthermore, the second nanowire pattern W2 may include the material same as that of the first nanowire pattern W1. However, exemplary embodiments of the present inventive concept are not limited thereto.

For example, in an exemplary embodiment in which the semiconductor device 1 includes a P-type transistor, the first and second nanowire patterns W1 and W2 contained in the P-type transistor may include, for example, a material having high hole mobility. For example, the first and second nanowire patterns W1 and W2 may include either silicon-germanium (SiGe) or germanium (Ge). However, exemplary embodiments of the present inventive concept are not limited thereto.

In an exemplary embodiment in which the semiconductor device 1 includes an N-type transistor, the first and second nanowire patterns W1 and W2 contained in the N-type transistor may include, for example, a material having high electron mobility. For example the first and second nanowire patterns W1 and W2 may include either Si or a group III-V compound semiconductor. However, exemplary embodiments of the present inventive concept are not limited thereto.

The group III-V compound semiconductor may be, for example, one of a binary compound, a ternary compound and a quaternary compound in which at least one of aluminum (Al), gallium (Ga) and indium (In) as a group III element and one of phosphorus (P), arsenic (As) and antimonium (Sb) as a group V element are combined.

Although each of the first and second nanowire patterns W1 and W2 is depicted as having a rectangular cross-section in FIGS. 2 and 3, exemplary embodiments of the present inventive concept are not limited thereto. For example, in exemplary embodiments, corners of the first and second nanowire patterns W1 and W2 can be rounded through a trimming process.

The first gate NG1 is disposed to extend in a second direction Y on the first active region AR1. FIGS. 2 and 3 also illustrate a third direction Z. The second direction Y crosses the first direction X. The first gate NG1 is disposed to surround (e.g., entirely surround) the perimeter/boundary of each of the first and second nanowire patterns W1 and W2 spaced apart from the first active region AR1. As used herein, the terms perimeter and boundary may be used interchangeably.

The first gate NG1 is also disposed in the space between the first nanowire pattern W1 and the second nanowire pattern W2 and the space between the first active pattern AR1 and the first nanowire pattern W1.

The first gate NG1 includes a first region NR1 disposed on (e.g., above) the first nanowire pattern W1 and a second region NR2 disposed beneath the first nanowire pattern W1. The width of the first region NR1 in the first direction X is the third width L3, and the width of the second region NR2 in the first direction X is the first width L1. The first width L1 is wider than the third width L3.

Each of the first and second dummy gates DG1 and DG2 is disposed to extend in the second direction Y on the first active region AR1. Furthermore, the first and second dummy gates DG1 and DG2 may be provided at both sides of the first gate NG1, respectively, and spaced apart from the first gate NG1 in the first direction X.

A part of the first dummy gate DG1 may be overlapped with one end of the first field insulating layer FI1 and the rest of the first dummy gate DG1 may be overlapped with one end of the first active region AR1. Furthermore, a part of the second dummy gate DG2 may be overlapped with one end of the second field insulating layer FI2 and the rest of the second dummy gate DG2 may be overlapped with the other end of the first active region AR1.

The first dummy gate DG1 is disposed to cover (e.g., entirely cover) the perimeter of one end of each of the first and second nanowire patterns W1 and W2 spaced apart from the first active region AR1 and an end surface of one end of each of the first and second nanowire patterns W1 and W2. The second dummy gate DG2 is disposed to cover (e.g., entirely cover) the perimeter of the other end of each of the first and second nanowire patterns W1 and W2 spaced apart from the first active region AR1 and an end surface of the other end of each of the first and second nanowire patterns W1 and W2.

Each of the first and second dummy gates DG1 and DG2 is also disposed in the space between the first nanowire pattern W1 and the second nanowire pattern W2 and the space between the first active pattern AR1 and the first nanowire pattern W1.

Each of the first gate NG1 and the first and second dummy gates DG1 and DG2 may include, for example, at least one of TiN, WN, TaN, Ru, TiC, TaC, Ti, Ag, Al, TiAl, TiAlN, TiAlC, TaCN, TaSiN, Mn, Zr, W and Al. Alternatively, each of the first gate NG1 and the first and second dummy gates DG1 and DG2 may be formed of a non-metal material such as, for example, Si or SiGe. The first gate NG1 and the first and second dummy gates DG1 and DG2 described above may be disposed, for example, through a replacement process. However, exemplary embodiments of the present inventive concept are not limited thereto.

The first gate spacer NSP1 is disposed at both sidewalls of the first gate NG1 extended in the second direction Y. Furthermore, the first gate insulating layer NGI1 may be disposed along sidewalls of the first gate spacer NSP1.

The first and second dummy gate spacers DSP1 and DSP2 may be disposed respectively at both side walls of the first and second dummy gates DG1 and DG2 extended in the second direction Y. Furthermore, the first and second dummy gate insulating layers DGI1 and DGI2 may be disposed along sidewalls of each of the first and second dummy date spacers DSP1 and DSP2.

Each of the first gate spacer NSP1 and the first and second dummy gate spacers DSP1 and DSP2 may include, for example, at least one of silicon nitride (SiN), silicon oxynitride (SiON), silicon oxide ($SiO_2$), silicon carbon oxynitride (SiOCN) or a combination thereof. Although each of the first gate spacer NSP1 and the first and second dummy gate spacers DSP1 and DSP2 is depicted as a single layer, exemplary embodiments of the present inventive concept are not limited thereto. For example, according to exemplary embodiments of the present inventive concept, each of the first gate spacer NSP1 and the first and second dummy gate spacers DSP1 and DSP2 may have a multi-layer structure.

The first gate insulating layer NGI1 may be disposed between the first nanowire pattern W1 and the first gate NG1, and between the first nanowire pattern W1 and the second nanowire pattern W2. The first gate insulating layer NGI1 may further be disposed between the first gate NG1 and the first gate spacer NSP1. Furthermore, the first gate insulating layer NGI1 may further be disposed between the first active region AR1 and the first gate NG1.

The first gate insulating layer NGI1 may be conformally disposed along the perimeters of the first and second nanowire patterns W1 and W2 and sidewalls of the first gate NG1. Herein, when a certain layer or element is described as being conformally disposed along another layer(s) or element(s), it is to be understood that the certain layer or element is formed such that its shape conforms to the shape of the another layer(s) or element(s). Alternatively, the first gate insulating layer NGI1 may be conformally disposed along the perimeters of the first and second nanowire patterns W1 and W2 and sidewalls of the first gate spacer NSP1. The first gate insulating layer NGI1 may be disposed along an upper surface of the first active region AR1. Furthermore, the first gate insulating layer NGI1 may be disposed along a partial surface of the first source or drain epitaxial layer SDR1. Herein, the term "source or drain epitaxial layer" indicates that the layer may be used to form either a source or a drain.

Since the first gate insulating layer NGI1 is disposed between a sidewall of the first gate NG1 and a sidewall of the first gate spacer NSP1, one side surface of the first gate insulating layer NGI1 is disposed along the sidewall of the first gate NG1 and the other side surface of the first gate insulating layer NGI1 is disposed along the sidewall of the first gate spacer NSP1.

The first dummy gate insulating layer DGI1 may be disposed between the first nanowire pattern W1 and the first dummy gate DG1 and between the first nanowire pattern W1 and the second nanowire pattern W2. The first dummy gate insulating layer DCI1 may be disposed between the first dummy gate DG1 and the first dummy gate spacer DSP1. Furthermore, the first dummy gate insulating layer DGI1 may be disposed between the first active region AR1 and the first dummy gate DG1.

The first dummy gate insulating layer DGI1 may be conformally disposed along the perimeter and the end surface of one end of each of the first and second nanowire patterns W1 and W2 and along the sidewalls of the first dummy gate DG1. Alternatively, the first dummy gate insulating layer DGI1 may be conformally disposed along the perimeter and the end surface of one end of each of the first and second nanowire patterns W1 and W2 and along the sidewalls of the first dummy gate spacer DSP1. The first dummy gate insulating layer DGI1 may be disposed along an upper surface of the first field insulating layer FI1 and the upper surface of the first active region AR1. Furthermore, the first dummy gate insulating layer DGI1 may be disposed along a partial surface of the first source or drain epitaxial layer SDR1.

Since the first dummy gate insulating layer DGI1 is disposed between the sidewall of the first dummy gate DG1 and the sidewall of the first dummy gate spacer DSP1, one side surface of the first dummy gate insulating layer DGI1 is disposed along the sidewall of the first dummy gate DG1 and the other side surface of the first dummy gate insulating layer DGI1 is disposed along the sidewall of the first dummy gate spacer DSP1.

The second dummy gate insulating layer DGI2 may be disposed between the first nanowire pattern W1 and the second dummy gate DG2 and between the first nanowire pattern W1 and the second nanowire pattern W2. The second dummy gate insulating layer DGI2 may further be disposed between the second dummy gate DG2 and the second dummy gate spacer DSP2. Furthermore, the second dummy gate insulating layer DGI2 may be disposed between the first active region AR1 and the second dummy gate DG2.

The second dummy gate insulating layer DGI2 may be conformally disposed along the perimeter and end surface of the other end of each of the first and second nanowire patterns W1 and W2 and sidewalls of the second dummy gate DG2. Alternatively, the second dummy gate insulating layer DGI2 may be conformally disposed along the perimeter and end surface of the other end of each of the first and second nanowire patterns W1 and W2 and sidewalls of the second dummy gate spacer DSP2. The second dummy gate insulating layer DGI2 may be disposed along an upper surface of the second field insulating layer FI2 and the upper surface of the first active region AR1. Furthermore, the second dummy gate insulating layer DGI2 may be disposed along a partial surface of the first source or drain epitaxial layer SDR1.

Since the second dummy gate insulating layer DGI2 is disposed between the sidewall of the second dummy gate DG2 and the sidewall of the second dummy gate spacer DSP2, one side surface of the second dummy gate insulating layer DGI2 is disposed along the sidewall of the second dummy gate DG2 and the other side surface of the second dummy gate insulating layer DGI2 is disposed along the sidewall of the second dummy gate spacer DSP2.

Each of the first gate insulating layer NGI1 and the first and second dummy gate insulating layers DGI1 and DGI2 may include a high dielectric constant material having a dielectric constant higher than that of a silicon oxide layer. For example, each of the first gate insulating layer NGI1 and the first and second dummy gate insulating layers DGI1 and DGI2 may include one or more from among hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. However, exemplary embodiments of the present inventive concept are not limited thereto.

The first source or drain epitaxial layer SDR1 may be disposed on at least one side of the first nanowire pattern W1. That is, the first source or drain epitaxial layer SDR1 may be disposed between the first gate NG1 and the first dummy gate DG1 and between the first gate NG1 and the second dummy gate DG2. Furthermore, the first source or drain epitaxial layer SDR1 may be disposed on the first active region AR1 and connected (e.g., directly connected) to the first and second nanowire patterns W1 and W2 which are used as a channel region.

The first source or drain epitaxial layer SDR1 may include an upper region having a first width EL1 and a lower region having a second width EL2. The lower region of the first source or drain epitaxial layer SDR1 may be connected (e.g., directly connected) to the first active region AR1. The upper region of the first source or drain epitaxial layer SDR1 may be disposed on the lower region and connected (e.g., directly connected) to the first and second nanowire patterns W1 and W2.

The width EL1 of the upper region of the first source or drain epitaxial layer SDR1 is wider than the width EL2 of the lower region of the first source or drain epitaxial layer SDR1.

An outer boundary of the first source or drain epitaxial layer SDR1 may have various shapes. For example, the outer boundary of the epitaxial layer EP may have at least one of a diamond shape, a circular shape and a rectangular shape.

The first source or drain epitaxial layer SDR1 may include, for example, a material that can apply compressive stress to the first and second nanowire patterns W1 and W2 which are used as a channel region of a p-channel metal-oxide-semiconductor field-effect transistor (MOSFET) (PMOS). The first source or drain epitaxial layer SDR1 may include a material having a lattice constant larger than that of the first and second nanowire patterns W1 and W2. In an exemplary embodiment in which the first and second nanowire patterns W1 and W2 include SiGe, the first source or drain epitaxial layer SDR1 may include SiGe in which the Ge content is higher than that of the first and second nanowire patterns W1 and W2.

Furthermore, the first source or drain epitaxial layer SDR1 may include, for example, a material that can apply tensile stress to the first and second nanowire patterns W1 and W2 which are used as a channel region of an n-channel MOSFET (NMOS) or the same material as that of the first and second nanowire patterns W1 and W2. The first source or drain epitaxial layer SDR1 may include a material having a lattice constant smaller than that of the first and second nanowire patterns W1 and W2 or the same material as that of the first and second nanowire patterns W1 and W2. In an exemplary embodiment in which the first and second nanowire patterns W1 and W2 are Si, the first source or drain epitaxial layer SDR1 may be Si or a material (e.g., silicon carbide (SiC)) having a lattice constant smaller than that of Si.

The first source or drain impurity layer E1 is disposed in the first active region AR1. The first source or drain epitaxial layer SDR1 may be disposed on the first source or drain impurity layer E1, and the first source or drain epitaxial layer SDR1 may be connected (e.g., directly connected) to the first source or drain impurity layer E1. The first source or drain impurity layer E1 may not be overlapped with the second region NR2 of the first gate NG1. The distance between the first source or drain impurity layers E1 may be the same as the first width L1 of the first gate NG1.

The second interlayer insulating layer ILD2 may be disposed on the first interlayer insulating layer ILD1. Furthermore, the first interlayer insulating layer ILD1 may be disposed on the first to fourth field insulating layers FI1 to FI4 such that the first interlayer insulating layer ILD1 covers the first gate NG1, the first and second dummy gates DG1 and DG2, etc.

Furthermore, the first and second interlayer insulating layers ILD1 and ILD2 may include at least one of a low dielectric constant material, an oxide layer, a nitride layer and an oxynitride layer. The low dielectric constant material may be formed of, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide or a combination thereof.

The first to fourth field insulating layers FI1 to FI4 may be disposed on the substrate 100.

The first to fourth field insulating layers FI1 to FI4 may be, for example, device isolation layers that isolate an active region disposed on the substrate 100. The first interlayer insulating layer ILD1 may be disposed on the first to fourth field insulating layers FI1 to FI4.

Furthermore, the first to fourth field insulating layers FI1 to FI4 may include at least one of a silicon oxide layer, a silicon nitride layer and a silicon oxynitride layer. However, exemplary embodiments of the present inventive concept are not limited thereto.

The semiconductor device 1 according to an exemplary embodiment of the present inventive concept may have a stacked nanosheet transistor structure. The gate length of a lower planar transistor of the first and second nanowire patterns W1 and W2 in the semiconductor device 1 may be elongated, thereby causing the lower planar transistor to become a long channel transistor. Thus, a source or drain impurity layer of the planar transistor may have a shallow junction depth. As a result, the distance between the source or drain impurity layers is elongated, thereby reducing leakage current between sources or drains in an off-state.

Hereinafter, a semiconductor device according to an exemplary embodiment of the present inventive concept will be described with reference to FIG. 4. For convenience of explanation, a further description of layers and elements previously described may be omitted herein.

Figure 4:
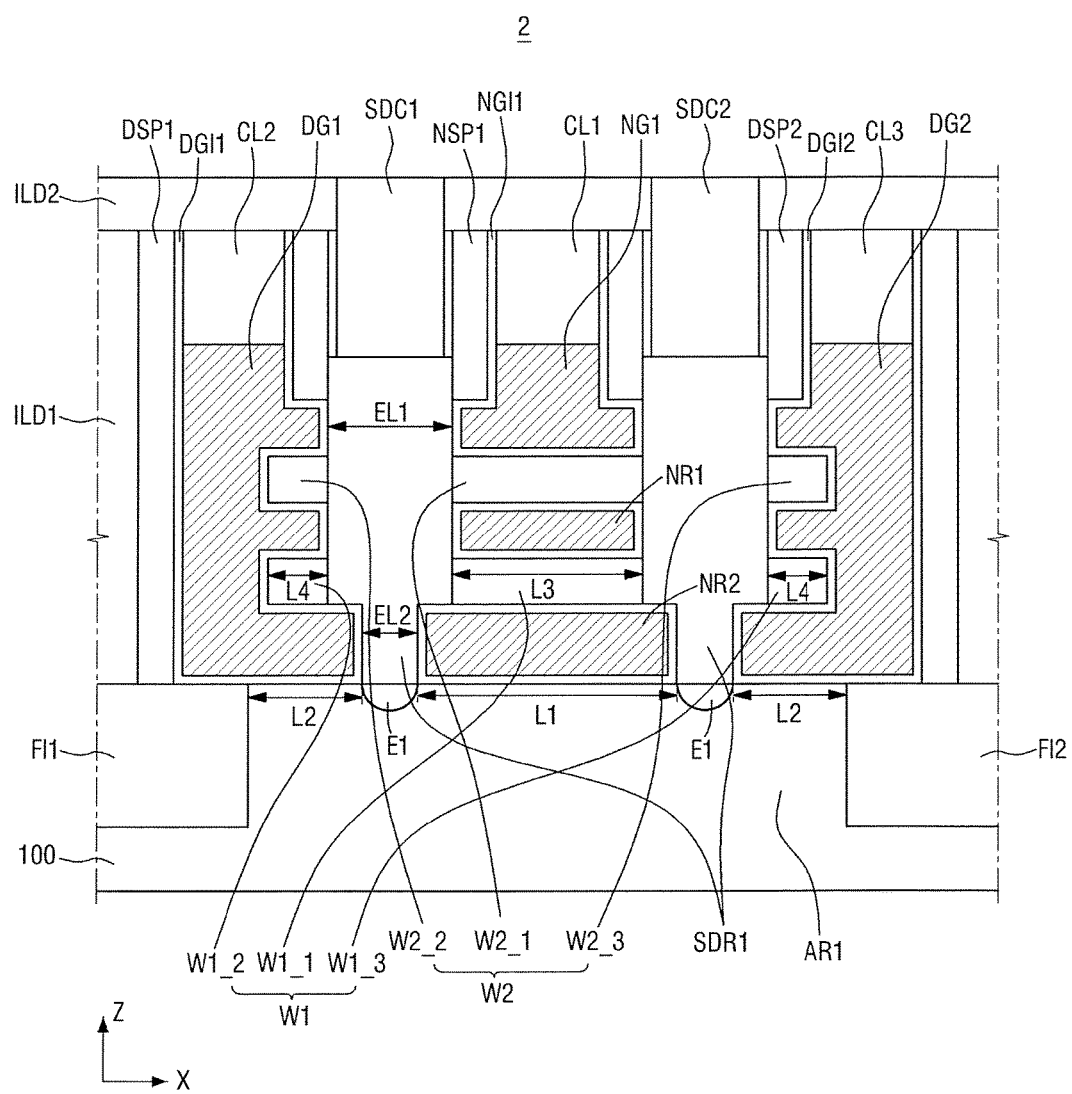
FIG. 4 is a cross-sectional view of a semiconductor device according to an exemplary embodiment of the present inventive concept.

FIG. 4 is a cross-sectional view of a semiconductor device according to an exemplary embodiment of the present inventive concept.

In the semiconductor device 2 of FIG. 4, upper portions of the first gate NG1 and the first and second dummy gates DG1 and DG2 are partially etched, and first to third capping layers CL1 to CL3 are disposed in the etched part.

In this case, the first capping layer CL1 may be disposed on the first gate NG1, and the second and third capping layers CL2 and CL3 may be disposed on the first and second dummy gates DG1 and DG2, respectively. The first to third capping layers CL1 to CL3 may include, for example, SiN. However, exemplary embodiments of the present inventive concept are not limited thereto.

The second interlayer insulating layer ILD2 may be disposed on the first to third capping layers CL1 to CL3, and the first to third capping layers CL1 to CL3 may be covered by the second interlayer insulating layer ILD2.

A process for fabricating the first to third capping layers CL1 to CL3 will be described below.

Hereinafter, a semiconductor device according to an exemplary embodiment of the present inventive concept will be described with reference to FIGS. 5 and 6. For convenience of explanation, a further description of layers and elements previously described may be omitted herein.

Figure 5:
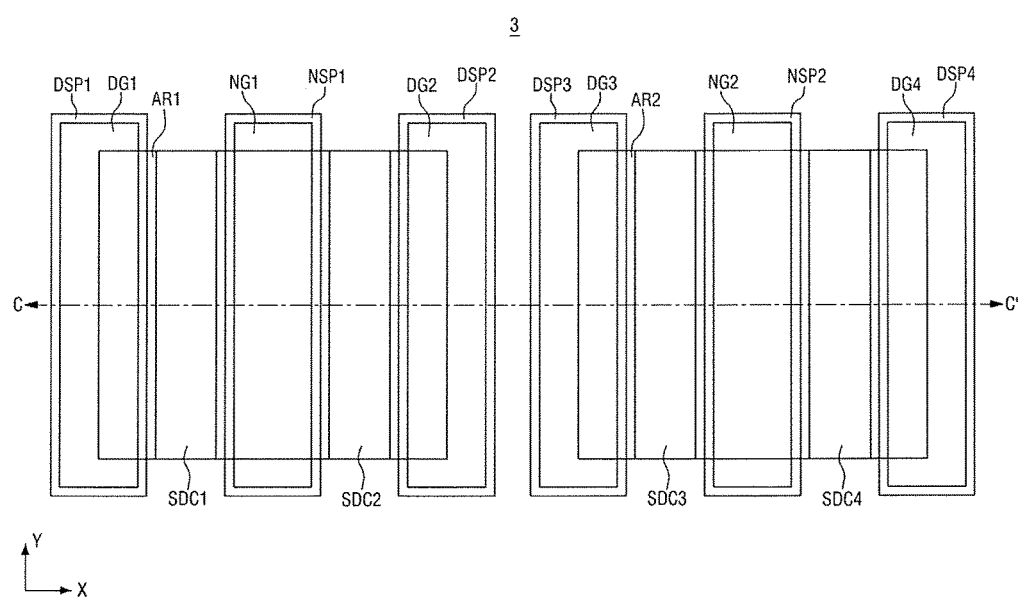
FIG. 5 is a top view of a semiconductor device according to an exemplary embodiment of the present inventive concept.

FIG. 5 is a top view of a semiconductor device according to an exemplary embodiment of the present inventive concept. FIG. 6 is a cross-sectional view taken along line C-C' of FIG. 5 according to an exemplary embodiment of the present inventive concept.

Figure 6:
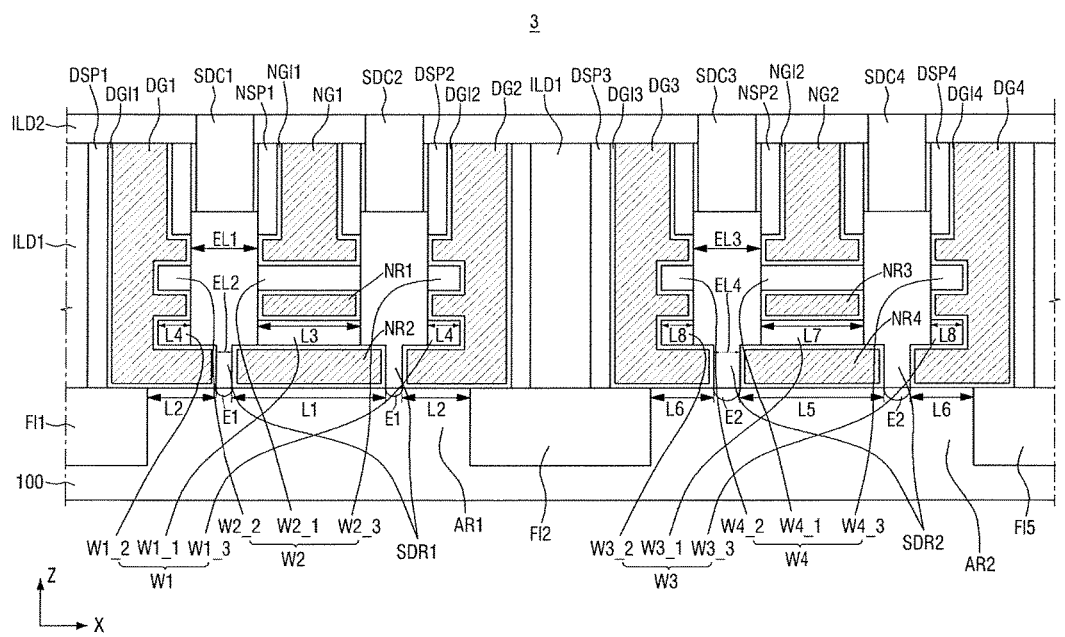
FIG. 6 is a cross-sectional view taken along line C-C' of FIG. 5 according to an exemplary embodiment of the present inventive concept.

In the semiconductor device 3 of FIG. 6, the substrate 100 may include first and second active regions AR1 and AR2, which are spaced apart from each other in the first direction X with the second field insulating layer FI2 disposed therebetween. In this case, the upper surface of each of the first and second active regions AR1 and AR2 may be disposed on substantially the same plane. In addition, a fifth field insulating layer FI5 may be disposed near the second active region AR2.

The first and second nanowire patterns W1 and W2 may be disposed on the first active region AR1, and third and fourth nanowire patterns W3 and W4 may be disposed on the second active region AR2.

The third nanowire pattern W3 may extend in the first direction X1 on the second active region AR2. Furthermore, the third nanowire pattern W3 may include a part W3_1 covered (e.g., entirely covered) by a second gate NG2 and parts W3_2 and W3_3 covered (e.g., entirely covered) by third and fourth dummy gates DG3 and DG4.

In this case, the width of a region in the first direction X in which the second active region AR2 and the second gate NG2 are overlapped with each other is a fifth width L5, and the width of a region in the first direction X in which the second active region AR2 and the third and fourth dummy gates DG3 and DG4 are overlapped with each other is a sixth width L6. The fifth width L5 and the sixth width L6 may be different from each other.

The width of the part W3_1 in the first direction X in which the third nanowire pattern W3 is covered (e.g., entirely covered) by the second gate NG2 is a seventh width L7, and the width of the parts W3_2 and W3_3 in the first direction X in which the third nanowire pattern W3 is covered by the third and fourth dummy gates DG3 and DG4 is an eighth width L8. The seventh width L7 and the eighth width L8 may be different from each other. In this case, unlike the second gate NG2, the third and fourth dummy gates DG3 and DG4 may cover (e.g., entirely cover) both ends of the third nanowire pattern W3, respectively.

For example, the third nanowire pattern W3 may penetrate through a part of each of the third and fourth dummy gates DG3 and DG4, the third dummy gate DG3 may cover (e.g., entirely cover) one end of the third nanowire pattern W3, and the fourth dummy gate DG4 may cover (e.g., entirely cover) the other end of the third nanowire pattern W3. In this case, the expression "the third nanowire pattern W3 may penetrate through a part of each of the third and fourth dummy gates DG3 and DG4" indicates that the third nanowire pattern W3 has reached a predetermined point inside the third and fourth dummy gates DG3 and DG4.

Furthermore, the part W3_1 in which the third nanowire pattern W3 is covered (e.g., entirely covered) by the second gate NG2 may be surrounded by a second source or drain epitaxial layer SDR2 and a second gate insulating layer NGI2. The parts W3_2 and W3_3 in which the third nanowire pattern W3 is covered (e.g., entirely covered) by the third and fourth dummy gates DG3 and DG4 may be surrounded by the second source or drain epitaxial layer SDR2 and third and fourth dummy gate insulating layers DGI3 and DGI4.

The fifth width L5 may be wider than the seventh width L7 and may differ from the first width L1. Furthermore, the sixth width L6 may be wider than the eighth width L8 and may differ from the second width L2.

For example, the width of the region in the first direction X in which the second active region AR2 and the second gate NG2 are overlapped with each other may be wider than the width of the region in the first direction X in which the third nanowire pattern W3 and the second gate NG2 are overlapped with each other. In addition, the width of the region in the first direction X in which the second active region AR2 and the second gate NG2 are overlapped with each other may be different from the width of the region in the first direction X in which the first active region AR1 and the first gate NG1 are overlapped with each other. Furthermore, the width of the region in the first direction X in which the second active region AR2 and the third and fourth gates DG3 and DG4 are overlapped with each other may be wider than the width of the region in the first direction X in which the third nanowire pattern W3 and the third and fourth dummy gates DG3 and DG4 are overlapped with each other. In addition, the width of the region in the first direction X in which the second active region AR2 and the third and fourth gates DG3 and DG4 are overlapped with each other may be different from the width of the region in the first direction X in which the first active region AR1 and the first and second dummy gates DG1 and DG2 are overlapped with each other.

That is, a part of the region in which the second active region AR2 and the second gate NG2 are overlapped with each other may be overlapped with the third nanowire pattern W3, and the rest of the region may be overlapped with one end of the second source or drain epitaxial layer SDR2.

Furthermore, a part of the region in which the second active region AR2 and the third and fourth dummy gates DG3 and DG4 are overlapped with each other may be overlapped with the third nanowire pattern W3, and the rest of the region may be overlapped with the other end of the second source or drain epitaxial layer SDR2.

The fourth nanowire pattern W4 may extend in the first direction X1 on the second active region AR2. The fourth nanowire pattern W4 may be disposed on the third nanowire pattern W3. Furthermore, the fourth nanowire pattern W4 may include a part W4_1 covered (e.g., entirely covered) by the second gate NG2 and parts W4_2 and W4_3 covered (e.g., entirely covered) by the third and fourth dummy gates DG3 and DG4.

The width of the fourth nanowire pattern W4 and the width of the third nanowire pattern W3 are substantially the same as each other in the first direction X. Furthermore, the fourth nanowire pattern W4 may include the material as that of the third nanowire pattern W3. However, exemplary embodiments of the present inventive concept are not limited thereto.

The second gate NG2 may extend in the second direction Y on the second active region AR2. The second gate NG2 is disposed to cover (e.g., entirely cover) the perimeter of each of the third and fourth nanowire patterns W3 and W4 which are spaced apart from the second active region AR2.

The second gate NG2 includes a third region NR3 disposed on (e.g., above) the third nanowire pattern W3 and a fourth region NR4 disposed beneath the third nanowire pattern W3. The width of the third region NR3 in the first direction X is the seventh width L7, and the width of the fourth region NR4 in the first direction X is the fifth width L5. The fifth width L5 is wider than the seventh width L7 and different from the first width L1.

Each of the third and fourth dummy gates DG3 and DG4 is disposed to extend in the second direction Y on the second active region AR2. Furthermore, the third and fourth dummy gates DG3 and DG4 may be disposed at both sides of the second gate NG2, respectively, and spaced apart from the second gate NG2 in the first direction X.

The third dummy gate DG3 is disposed to cover (e.g., entirely cover) the perimeter of one end of each of the third and fourth nanowire patterns W3 and W4 spaced apart from the second active region AR2 and an end surface of one end of each of the third and fourth nanowire patterns W3 and W4. The fourth dummy gate DG4 is disposed to cover (e.g., entirely cover) the perimeter of the other end of each of the third and fourth nanowire patterns W3 and W4 spaced apart from the second active region AR2 and an end surface of the other end of each of the third and fourth nanowire patterns W3 and W4.

A part of the second dummy gate DG2 may be overlapped with one end of the second field insulating layer FI2, and the rest of the second dummy gate DG2 may be overlapped with the first active region AR1. Furthermore, a part of the third dummy gate DG3 may be overlapped with the other end of the second field insulating layer FI2, and the rest of the third dummy gate DG3 may be overlapped with the second active region AR2.

The first interlayer insulating layer ILD1 may serve to isolate the transistor disposed on each active region, and more specifically, may serve to isolate the transistor on the first active region AR1 and the transistor on the second active region AR2. In this case, the transistor on the first active region AR1 may include, for example, the first and second nanowire patterns W1 and W2, the first gate NG1, the first and second dummy gates DG1 and DG2, the first gate insulating layer NGI1, the first and second dummy gate insulating layers DGI1 and DGI2, the first gate spacer NSP1, the first and second dummy gate spacers DSP1 and DSP2, and the first source or drain epitaxial layer SDR1. The transistor on the second active region AR2 may include, for example, the third and fourth nanowire patterns W3 and W4, the second gate NG2, the third and fourth dummy gates DG3 and DG4, the second gate insulating layer NGI2, the third and fourth dummy gate insulating layers DGI3 and DGI4, the second gate spacer NSP2, the third and fourth dummy gate spacers DSP3 and DSP4, and the second source or drain epitaxial layer SDR2.

The transistor on the first active region AR1 may be, for example, a P-type transistor, and the transistor on the second active region AR2 may be, for example, an N-type transistor.

Thus, the first and second nanowire patterns W1 and W2 may include, for example, a material having high hole mobility. The first and second nanowire patterns W1 and W2 may include, for example, either SiGe or Ge, however, exemplary embodiments of the present inventive concept are not limited thereto. Furthermore, the third and fourth nanowire patterns W3 and W4 may include, for example, a material having high electron mobility. The third and fourth nanowire patterns W3 and W4 may include, for example, either Si or a group III-V compound semiconductor, however, exemplary embodiments of the present inventive concept are not limited thereto.

The second source or drain epitaxial layer SDR2 may include an upper region having a third width EL3 and a lower region having a fourth width EL4. The lower region of the second source or drain epitaxial layer SDR2 may be connected (e.g., directly connected) to the second active region AR2. The upper region of the second source or drain epitaxial layer SDR2 may be disposed on the lower region, and connected (e.g., directly connected) to the third and fourth nanowire patterns W3 and W4.

The width EL4 of the lower region of the second source or drain epitaxial layer SDR2 may be narrower than the width EL3 of the upper region of the second source or drain epitaxial layer SDR2, and may be different from the width EL2 of the lower region of the first source or drain epitaxial layer SDR1.

The first source or drain epitaxial layer SDR1 may include, for example, a material that can apply compressive stress to the first and second nanowire patterns W1 and W2 which are used as a channel region of a PMOS transistor. The first source or drain epitaxial layer SDR1 may include a material having a lattice constant larger than that of the first and second nanowire patterns W1 and W2. In an exemplary embodiment in which the first and second nanowire patterns W1 and W2 include SiGe, the first source or drain epitaxial layer SDR1 may include SiGe in which the Ge content is higher than that of the first and second nanowire patterns W1 and W2.

The second source or drain epitaxial layer SDR2 may include, for example, a material that can apply tensile stress to the third and fourth nanowire patterns W3 and W4 which are used as a channel region of an NMOS transistor, or the material as that of the third and fourth nanowire patterns W3 and W4. The second source or drain epitaxial layer SDR2 may include a material having a lattice constant smaller than that of the third and fourth nanowire patterns W3 and W4 or the material as that of the third and fourth nanowire patterns W3 and W4. In an exemplary embodiment in which the third and fourth nanowire patterns W3 and W4 are Si, the second source or drain epitaxial layer SDR2 may be Si or a material (e.g., SiC) having a lattice constant smaller than that of Si.

A second source or drain impurity layer E2 is disposed in the second active region AR2. The second source or drain epitaxial layer SDR2 may be disposed on the second source or drain impurity layer E2, and the second source or drain epitaxial layer SDR2 may be connected (e.g., directly connected) to the second source or drain impurity layer E2. The second source or drain impurity layer E2 may not be overlapped with the fourth region NR4 of the second gate NG2. The distance between the second source or drain impurity layers E2 may be the same as the fifth width L5 of the second gate NG2. Thus, the distance between the first source or drain impurity layers E1 may be different from the distance between the second source or drain impurity layers E2.

In the semiconductor device 3 of FIG. 6, the first width L1, which is the width of the region in the first direction X in which the first active region AR1 and the first gate NG1 are overlapped with each other, and the fifth width L5, which is the width of the region in the first direction X in which the second active region AR2 and the second gate NG2 are overlapped with each other, are formed to be different from each other, thereby forming transistors having mutually different operating characteristics and reducing leakage current between sources or drains in an off-state of each transistor.

Hereinafter, a semiconductor device according to an exemplary embodiment of the present inventive concept will be described with reference to FIG. 7. For convenience of explanation, a further description of layers and elements previously described may be omitted herein.

Figure 7:
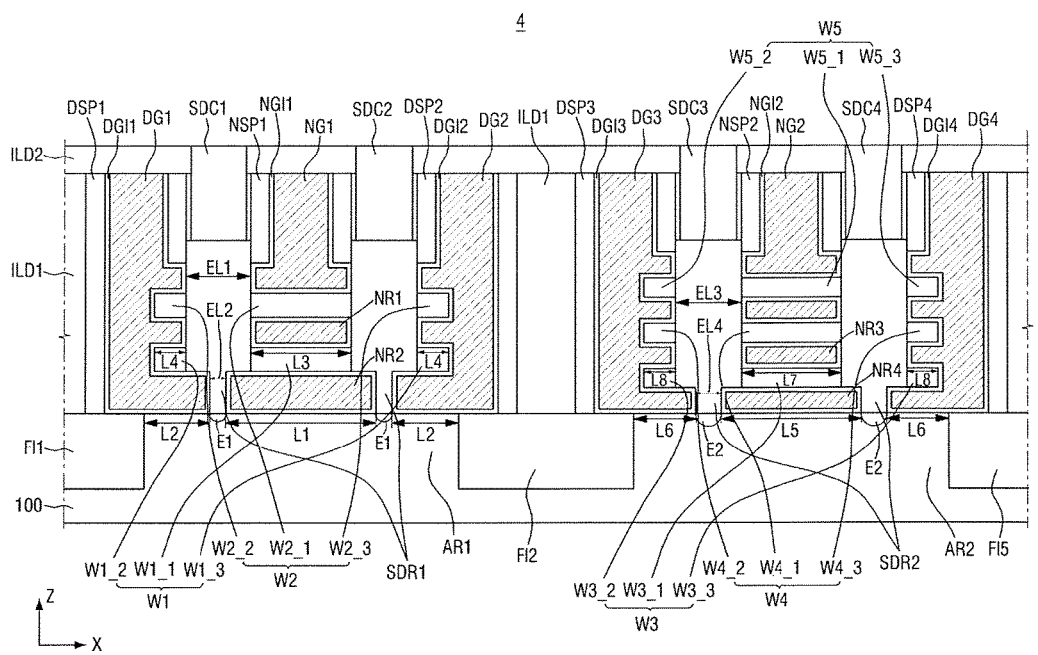
FIG. 7 is a cross-sectional view of a semiconductor device according to an exemplary embodiment of the present inventive concept.

FIG. 7 is a cross-sectional view of a semiconductor device according to an exemplary embodiment of the present inventive concept.

The semiconductor device 4 of FIG. 7 is provided with three nanowire patterns disposed on the second active region AR2. That is, two nanowire patterns (the first and second nanowire patterns W1 and W2) may be disposed on the first active region AR1, and three nanowire patterns (the third to fifth nanowire patterns W3 to W5) may be disposed on the second active region AR2. The fifth nanowire pattern W5 may include parts W5_1, W5_2 and W5_3.

That is, the transistor on the first active region AR1 and the transistor on the second active region AR2 may include different numbers of nanowire patterns.

Hereinafter, a semiconductor device according to an exemplary embodiment of the present inventive concept will be described with reference to FIG. 8. For convenience of explanation, a further description of layers and elements previously described may be omitted herein.

Figure 8:
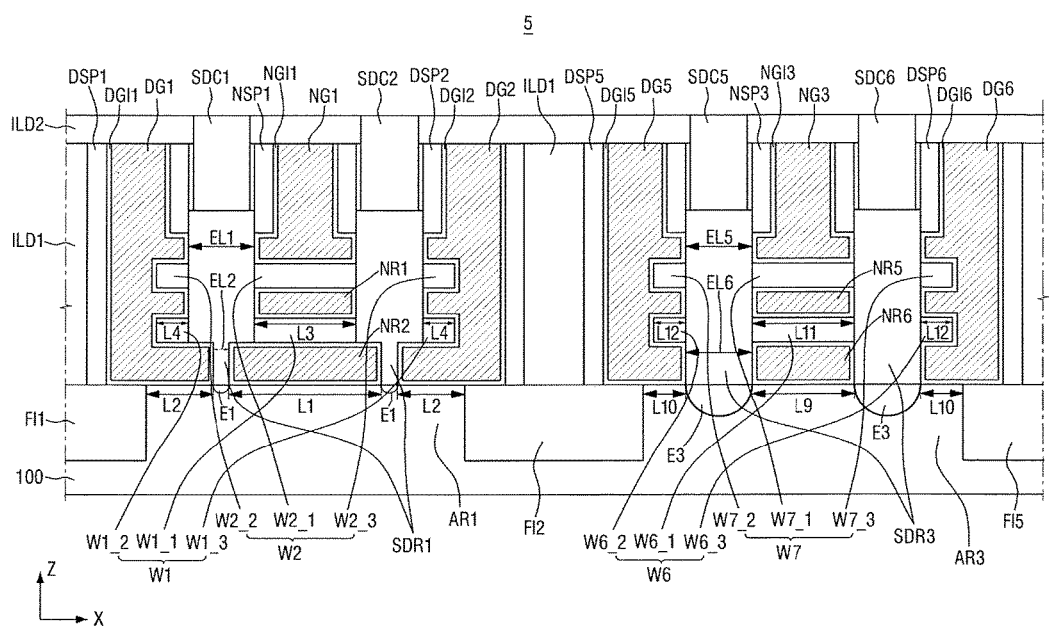
FIG. 8 is a cross-sectional view of a semiconductor device according to an exemplary embodiment of the present inventive concept.

FIG. 8 is a cross-sectional view of a semiconductor device according to an exemplary embodiment of the present inventive concept.

The semiconductor device 5 of FIG. 8 includes a sixth region NR6 disposed beneath a sixth nanowire pattern W6 (including parts W6_1, W6_2 and W6_3) and a third source or drain impurity layer E3. The width of the fifth region NR5 in the first direction X is an eleventh width L11, and the width of the sixth region NR6 in the first direction X is a ninth width L9. The eleventh width L11 and the ninth width L9 are substantially the same as each other. The semiconductor device 5 further includes a seventh nanowire pattern W7, which includes parts W7_1, W7_2 and W7_3.

A third source or drain epitaxial layer SDR3 and the third gate NG3 may not be overlapped with each other. The third source or drain epitaxial layer SDR3 and fifth and sixth dummy gates DG5 and DG6 may not be overlapped with each other.

The third source or drain epitaxial layer SDR3 may have an upper region having a fifth width EL5 and a lower region having a sixth width EL6. The width EL6 of the lower region of the third source or drain epitaxial layer SDR3 and the width EL5 of the upper region of the third source or drain epitaxial layer SDR3 are substantially the same as each other.

The distance between the third source or drain impurity layers E3 may be substantially the same as the ninth width L9 of the third gate NG3. That is, the distance between the first source or drain impurity layers E1 is different from the distance between the third source or drain impurity layers E3.

The semiconductor device 5 of FIG. 8 further includes a third active region AR3, a third gate spacer NSP3, a third gate insulating layer NGI3, fifth and sixth drain contacts SDC5 and SDC6, fifth and sixth dummy gate spacers DSP5 and DSP6, and fifth and sixth dummy gate insulating layers DGI5 and DGI6. In addition, FIG. 8 illustrates widths L10 and L12.

Hereinafter, a semiconductor device according to an exemplary embodiment of the present inventive concept will be described with reference to FIGS. 9 and 10. For convenience of explanation, a further description of layers and elements previously described may be omitted herein.

Figure 9:
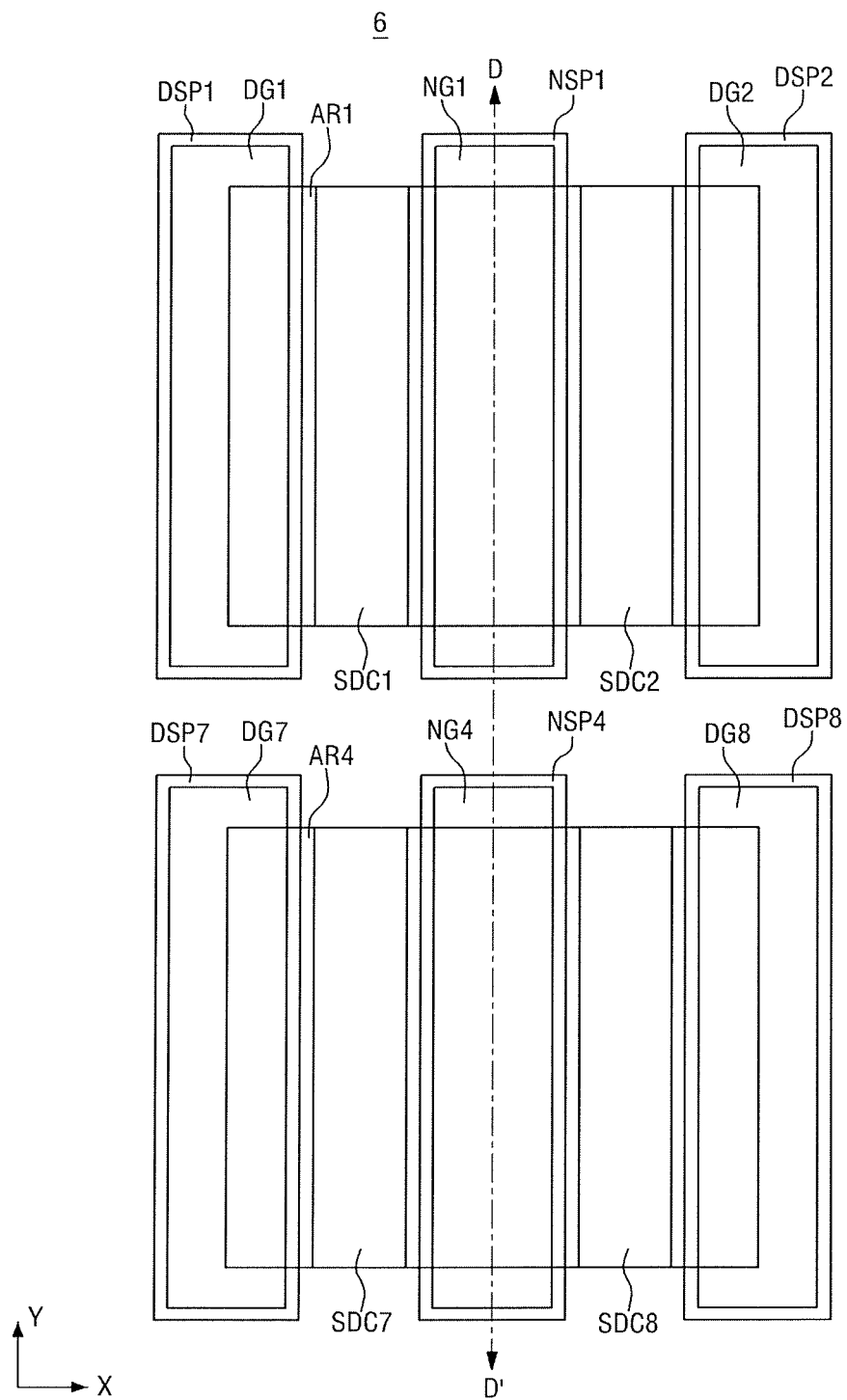
FIG. 9 is a top view of a semiconductor device according to an exemplary embodiment of the present inventive concept.

FIG. 9 is a top view of a semiconductor device according to an exemplary embodiment of the present inventive concept. FIG. 10 is a cross-sectional view taken along line D-D' of FIG. 9 according to an exemplary embodiment of the present inventive concept.

Figure 10:
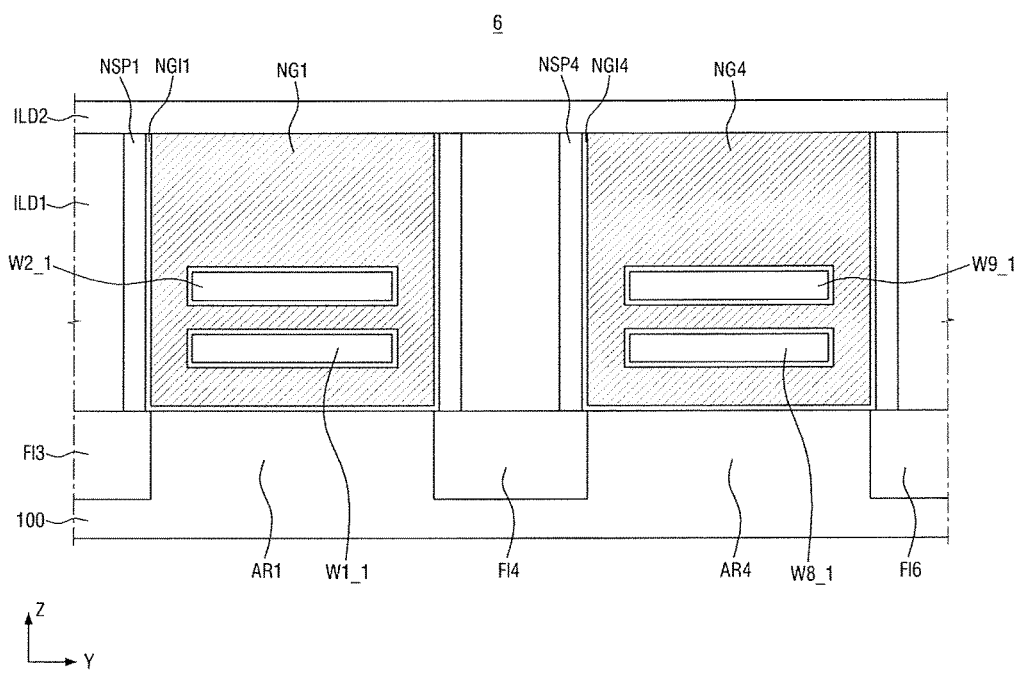
FIG. 10 is a cross-sectional view taken along line D-D' of FIG. 9 according to an exemplary embodiment of the present inventive concept.

The semiconductor 6 of FIG. 10 has active regions spaced apart from each other in the second direction Y.

That is, the first active region AR1 and a fourth active region AR4 may be spaced apart from each other in the second direction Y. The fourth active region AR4 may include a fourth gate NG4, a fourth gate spacer NSP4, seventh and eighth dummy gate spacers DSP7 and DSP8, seventh and eighth dummy gates DG7 and DG8, and seventh and eighth source or drain contacts SDC7 and SDC8.

Referring to FIG. 10, the first and fourth active regions AR1 and AR4 may be spaced apart from each other in the second direction Y about the fourth field insulating layer FI4 acting as a center. Part W8_1 of an eighth nanowire pattern W8 and part W9_1 of a ninth nanowire pattern W9 may be included in the fourth gate NG4, a fourth gate insulating layer NGI4 may be disposed between the fourth gate NG4 and the fourth gate spacer NSP4, and a sixth field insulating layer FI6 may be included in the semiconductor device 6.

The transistor on the first active region AR1 may be, for example, a P-type transistor, and the transistor on the fourth active region AR4 may be, for example, an N-type transistor.

The transistor on the first active region AR1 and the transistor on the fourth active region AR4 may include the same number of nanowire patterns.

Hereinafter, a semiconductor device according to an exemplary embodiment of the present inventive concept will be described with reference to FIG. 11. For convenience of explanation, a further description of layers and elements previously described may be omitted herein.

Figure 11:
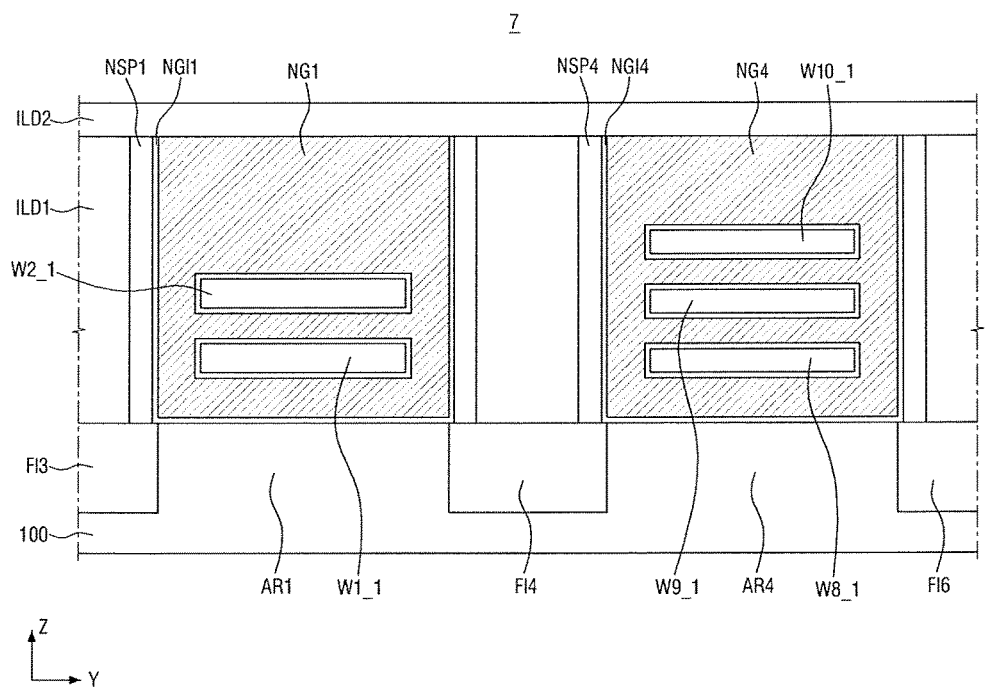
FIG. 11 is a cross-sectional view of a semiconductor device according to an exemplary embodiment of the present inventive concept.

FIG. 11 is a cross-sectional view of a semiconductor device according to an exemplary embodiment of the present inventive concept.

In the semiconductor device 7 of FIG. 11, a transistor on the first active region AR1 and a transistor on the fourth active region AR4 may include different numbers of nanowire patterns.

That is, the transistor on the first active region AR1 may include, for example, two nanowire patterns, and the transistor on the fourth active region AR4 may include, for example, three nanowire patterns (e.g., including part W10_1 of nanowire pattern W10).

FIGS. 12 to 25 are diagrams illustrating a method of fabricating the semiconductor device of FIG. 2 according to an exemplary embodiment of the present inventive concept.

Figure 12:
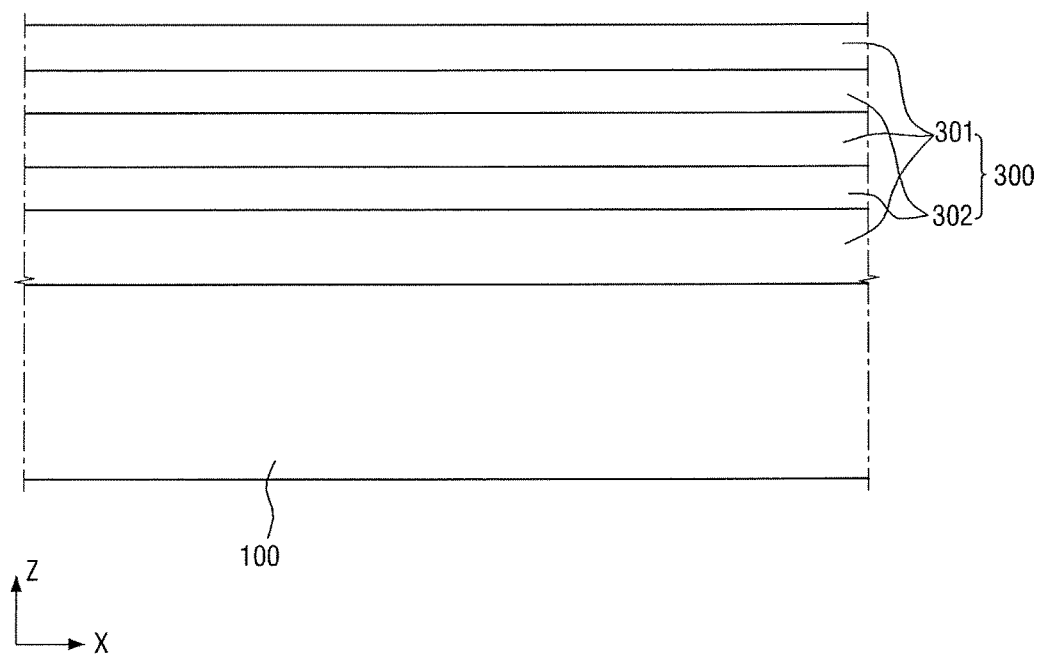
FIGS. 12 to 25 are diagrams illustrating a method of fabricating the semiconductor device of FIG. 2 according to an exemplary embodiment of the present inventive concept.

Referring first to FIG. 12, a stacked structure 300 is formed in which a sacrificial layer 301 and a semiconductor layer 302 are alternately stacked on the substrate 100.

For example, the sacrificial layer 301 of the stacked structure 300 contacting the substrate 100 may be bonded to the substrate 100 through, for example, a wafer bonding process. However, exemplary embodiments of the present inventive concept are not limited thereto.

The semiconductor layer 302 and the sacrificial layer 301 may be alternately formed on the sacrificial layer 301 that contacts the substrate 100. The sacrificial layer 301 and the semiconductor layer 302 may be formed, for example, through an epitaxial growth process. However, exemplary embodiments of the present inventive concept are not limited thereto. The stacked structure 300 may have a top layer which is, for example, the sacrificial layer 301, however, exemplary embodiments of the present inventive concept are not limited thereto.

The sacrificial layer 301 and the semiconductor layer 302 may include different materials. For example, the sacrificial layer 301 and the semiconductor layer 302 may include materials having mutually different etching selectivities. The sacrificial layer 301 may include, for example, either SiGe or Ge, however, exemplary embodiments of the present inventive concept are not limited thereto. The semiconductor layer 302 may include, for example, either Si or a group III-V compound semiconductor, however, exemplary embodiments of the present inventive concept are not limited thereto.

Subsequently, a first mask pattern (155 of FIG. 13) is formed to extend in the first direction X on the stacked structure 300.

The first mask pattern (155 of FIG. 13) may be formed of, for example, a material including at least one of a silicon oxide layer, a silicon nitride layer and a silicon oxynitride layer. However, exemplary embodiments of the present inventive concept are not limited thereto.

Figure 13:
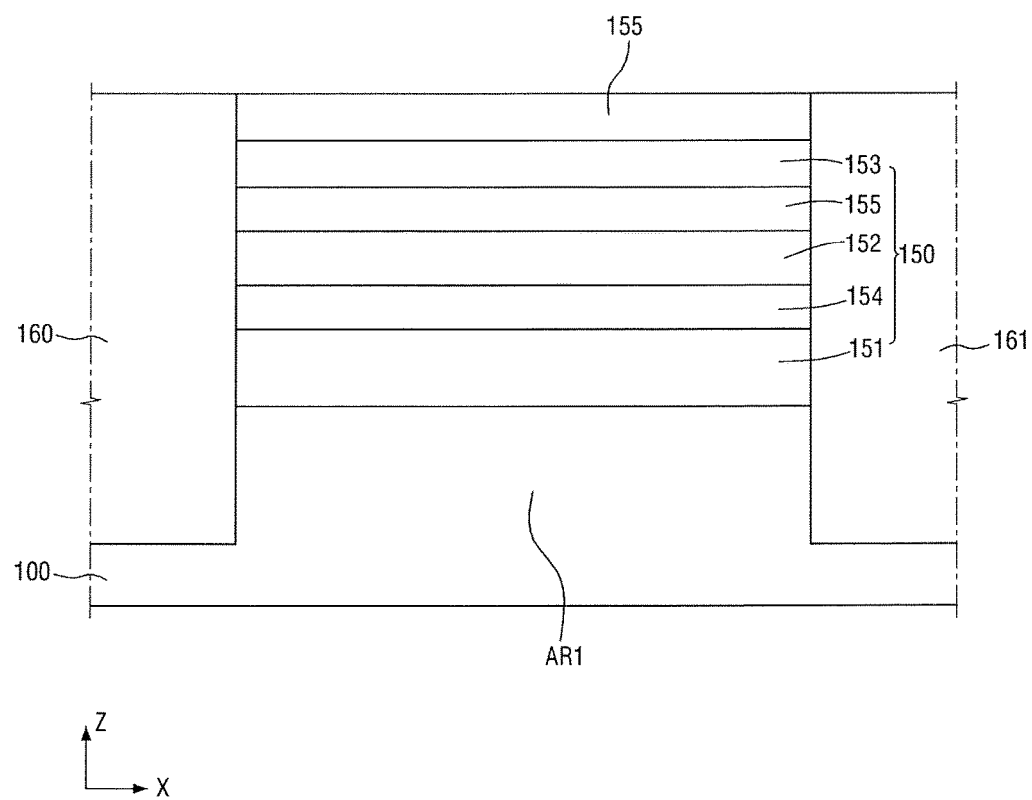

Referring to FIG. 13, the stacked structure 300 may be etched using the first mask pattern 155 as a mask, thereby forming a semiconductor pattern structure 150. For example, the stacked structure 300 may be etched until an upper surface of the substrate 100 is exposed, thereby forming the semiconductor pattern structure 150.

The semiconductor pattern structure 150 may extend in the first direction X. The semiconductor pattern structure 150 may include a first sacrificial layer 151 and a first semiconductor layer 154 alternately stacked on the substrate 100.

That is, the semiconductor pattern structure 150 may include the first sacrificial layer 151, the first semiconductor layer 154 formed on the first sacrificial layer 151, a second sacrificial layer 152 formed on the first semiconductor layer 154, and a second semiconductor layer 155 formed on the second sacrificial layer 152.

Furthermore, a part of the substrate 100 may also be etched during etching of the stacked structure 300, thereby forming the first active region AR1. An interlayer insulating layer is formed to cover the substrate 100 and the first mask pattern 155, and then a planarization process is performed until an upper surface of the first mask pattern 155 is exposed, thereby forming interlayer insulating layers 160 and 161 of FIG. 13.

Subsequently, the first mask pattern 155 provided on the semiconductor pattern structure 150 may be removed.

Figure 14:
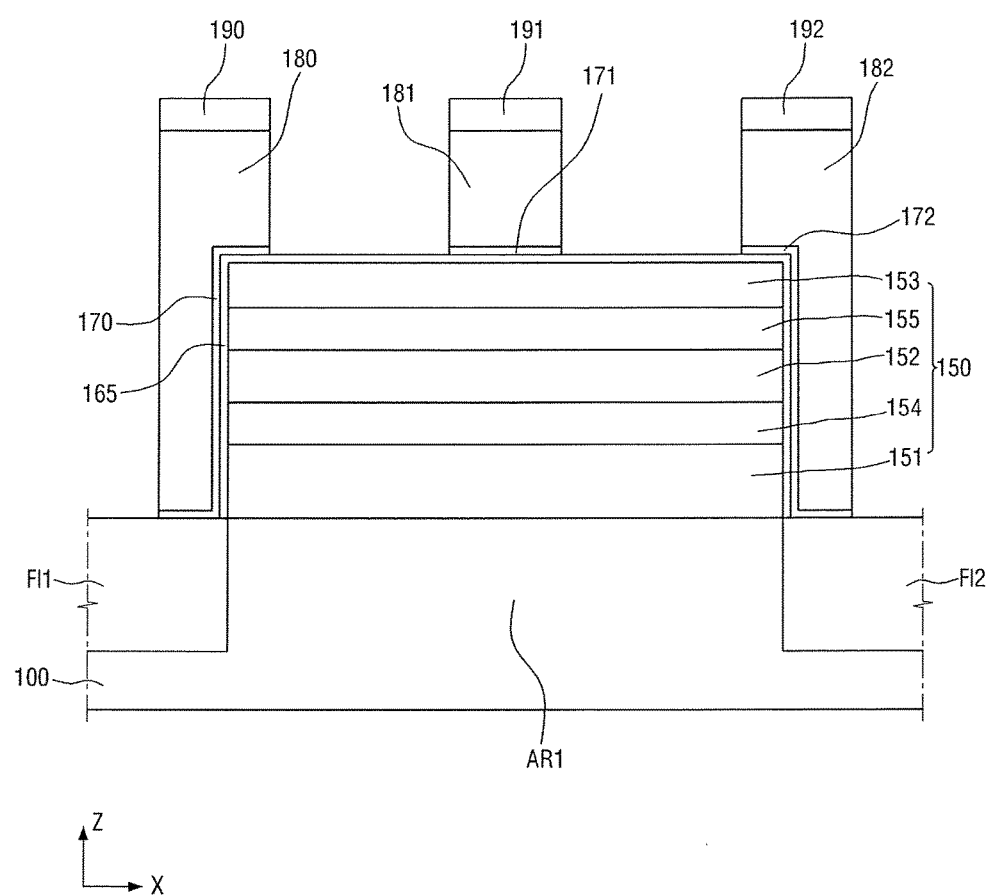

Referring to FIG. 14, an etching process is performed using second mask patterns 190, 191 and 192, thereby forming gate insulating layers 170, 171 and 172 and sacrificial gates 180, 181 and 182 intersecting the semiconductor pattern structure 150 and extending in the second direction Y. The etching process forms the sacrificial gates 180, 181 and 182 on the semiconductor pattern structure 150. In addition, each of the gate insulating layers 170, 171 and 172 may be formed along sidewalls and an upper surface of an insulating layer 165, and on upper surfaces of the first and second field insulating layers FI1 and FI2.

In this case, the insulating layer 165 may be formed to cover the semiconductor pattern structure 150, and the insulating layer 165 may be disposed between the semiconductor pattern structure 150 and the gate insulating layers 170, 171 and 172. In this case, the insulating layer 165 may be, for example, an oxide layer, such as SiO2. However, exemplary embodiments of the present inventive concept are not limited thereto.

The gate insulating layers 170, 171 and 172 may be silicon oxide layers, and the sacrificial gates 180, 181 and 182 may be either polysilicon or amorphous silicon. However, exemplary embodiments of the present inventive concept are not limited thereto.

Figure 15:
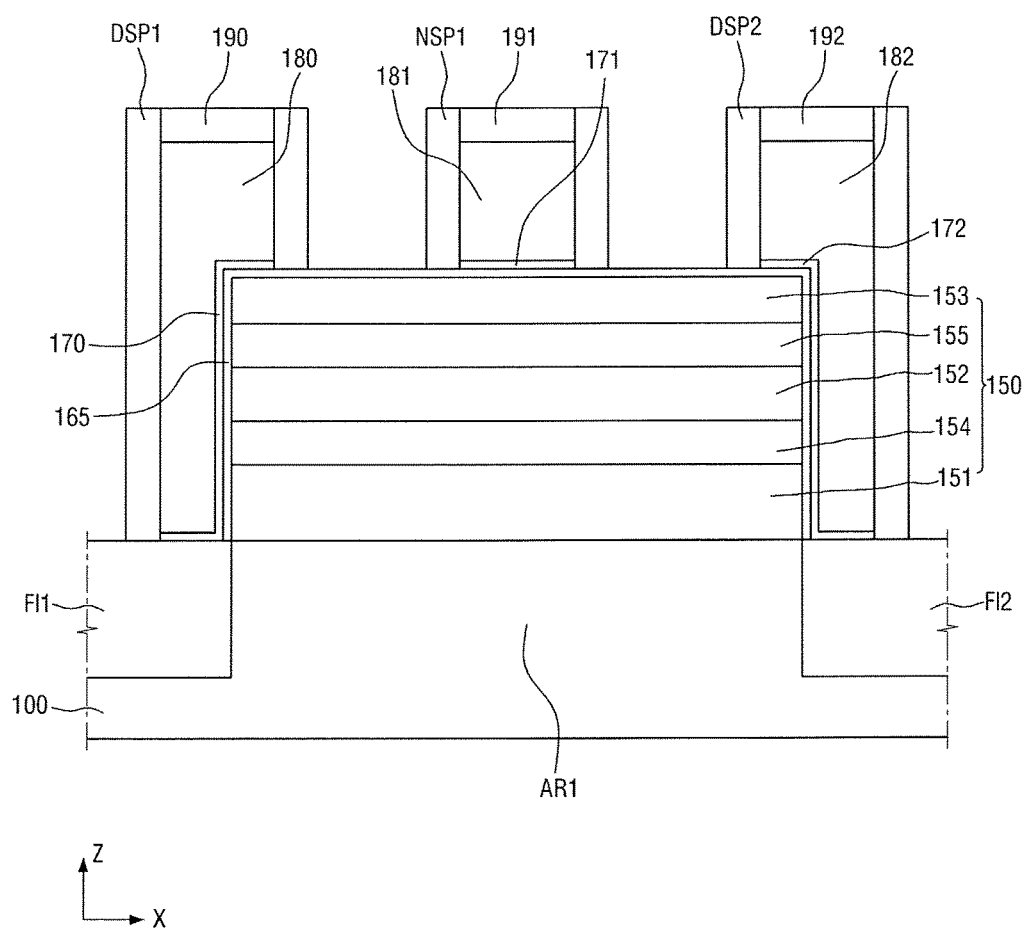

Referring to FIG. 15, a first gate spacer NSP1 and first and second dummy gate spacers DSP1 and DSP2 are formed on sidewalls of the sacrificial gates 180, 181 and 182.

For example, a spacer layer is formed on the substrate 100 to cover the sacrificial gates 180, 181 and 182 and the semiconductor pattern structure 150. Then, the spacer layer is etched back, thereby forming the first gate spacer NSP1 and the first and second dummy gate spacers DSP1 and DSP2 on the sidewalls of the sacrificial gates 180, 181 and 182.

Figure 16:
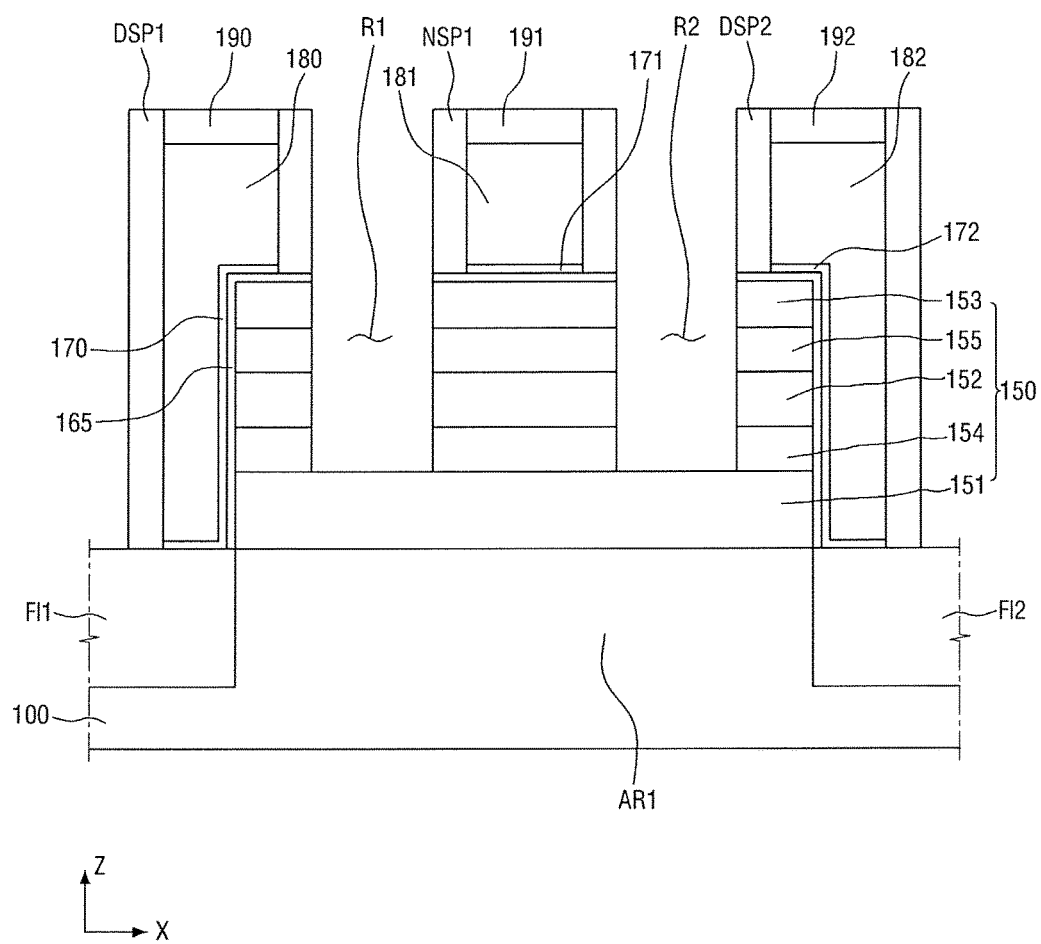

Referring to FIG. 16, parts of the semiconductor pattern structure 150 exposed between the first gate spacer NSP1 and the first dummy gate spacer DSP1 and between the first gate spacer NSP1 and the second dummy gate spacer DSP2 are removed, thereby forming first and second recesses R1 and R2 in the semiconductor pattern structure 150.

For example, the first and second recesses R1 and R2 may be formed by etching the first and second semiconductor layers 154 and 155 and the second and third sacrificial layers 152 and 153 using the sacrificial gates 180, 181 and 182, the first gate spacer NSP1, and the first and second dummy gate spacers DSP1 and DSP2 as a mask, resulting in an upper surface of the first sacrificial layer 151 being exposed.

A reactive-ion etching (RIE) process can be selectively applied in which an etching rate of the first sacrificial layer 151 and the first semiconductor layer 154 is controlled to prevent the first sacrificial layer 151 contacting the first active region AR1 from being etched, and to allow the first and second semiconductor layers 154 and 155 and the second and third sacrificial layers 152 and 153 to be etched. Thus, the etching process can be stopped when the first sacrificial layer 151 contacting the first active region AR1 is exposed.

Thus, the rest of the semiconductor pattern structure 150 may be removed, leaving the first sacrificial layer 151 which is overlapped with the first and second recesses R1 and R2 and which contacts the first active region AR1.

The second and third sacrificial layers 152 and 153 and the first and second semiconductor layers 154 and 155, which are alternately stacked on the first active region AR1, are exposed through side surfaces of the first and second recesses R1 and R2.

Figure 17:
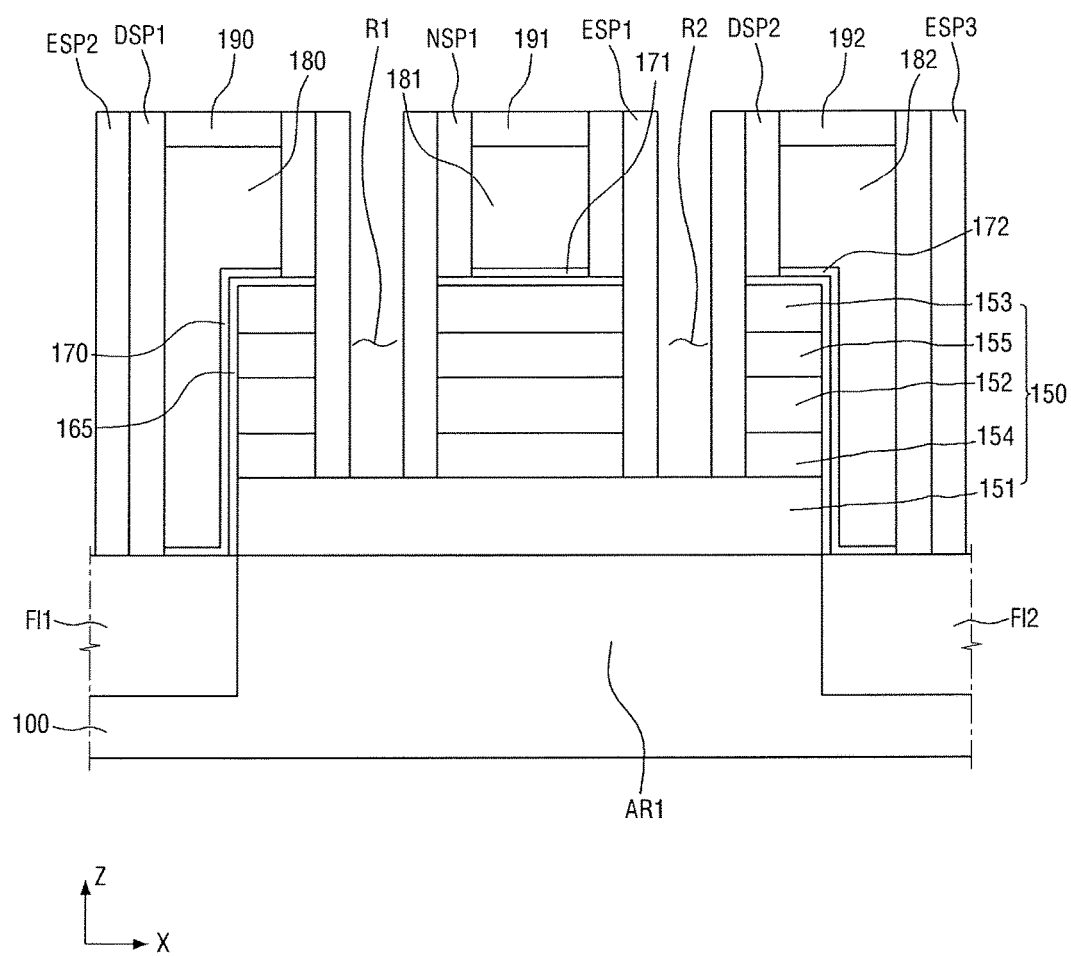

Referring to FIG. 17, a first inner spacer ESP1 is formed at sidewalls of the first gate spacer NSP1, and second and third inner spacers ESP2 and ESP3 are formed at sidewalls of the first and second dummy gate spacers DSP1 and DSP2.

For example, a spacer layer that covers the gates 180, 181 and 182, the first gate spacer NSP1, the first and second dummy gate spacers DSP1 and DSP2, and the semiconductor pattern structure 150 is formed on the substrate 100. The spacer layer is then etched back, thereby forming the first inner spacer ESP1 at sidewalls of the first gate spacer NSP1 and the second and third inner spacers ESP2 and ESP3 at sidewalls of the first and second dummy gates DSP1 and DSP2.

Figure 18:
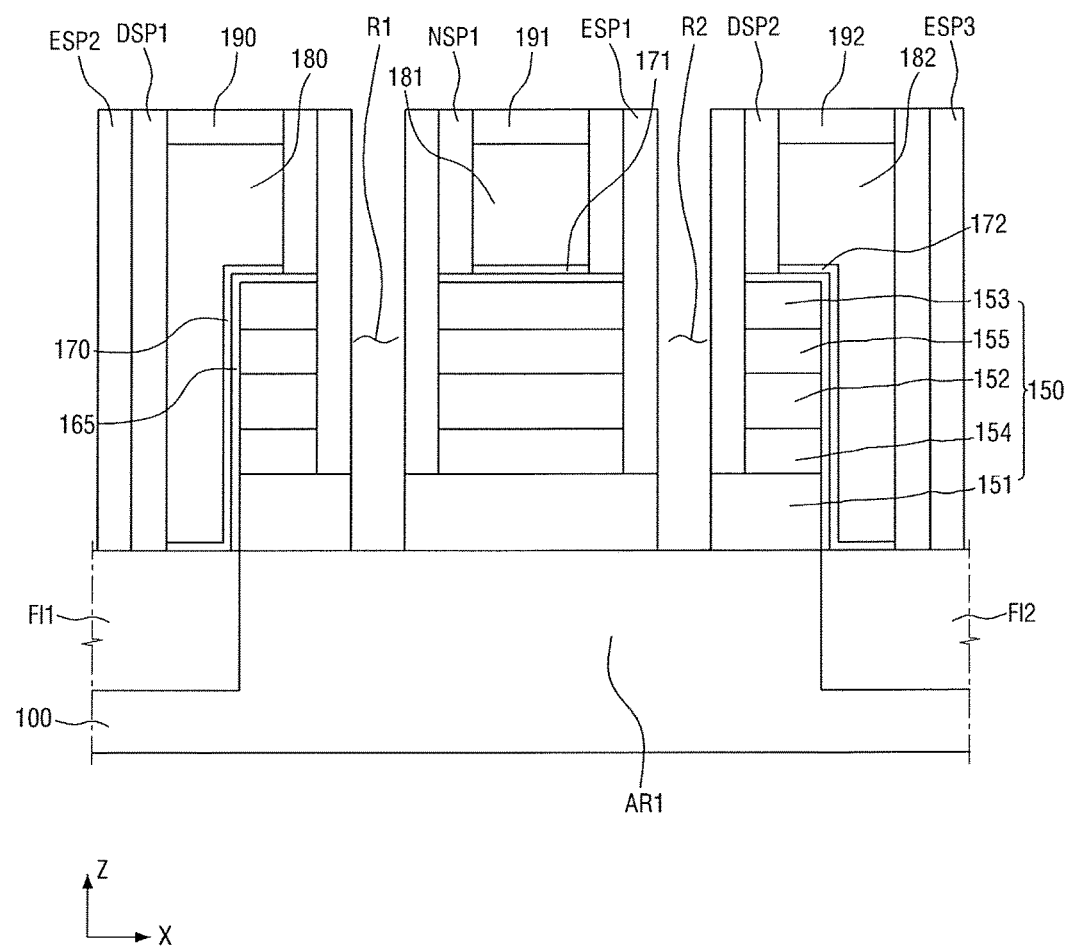

Referring to FIG. 18, the first sacrificial layer 151 exposed between the first inner spacer ESP1 and the second inner spacer ESP2, and between the first inner spacer ESP1 and the third inner spacer ESP3, may be removed. Thus, the area of the first active region AR1 exposed to the first and second recesses R1 and R2 may be reduced.

Figure 19:
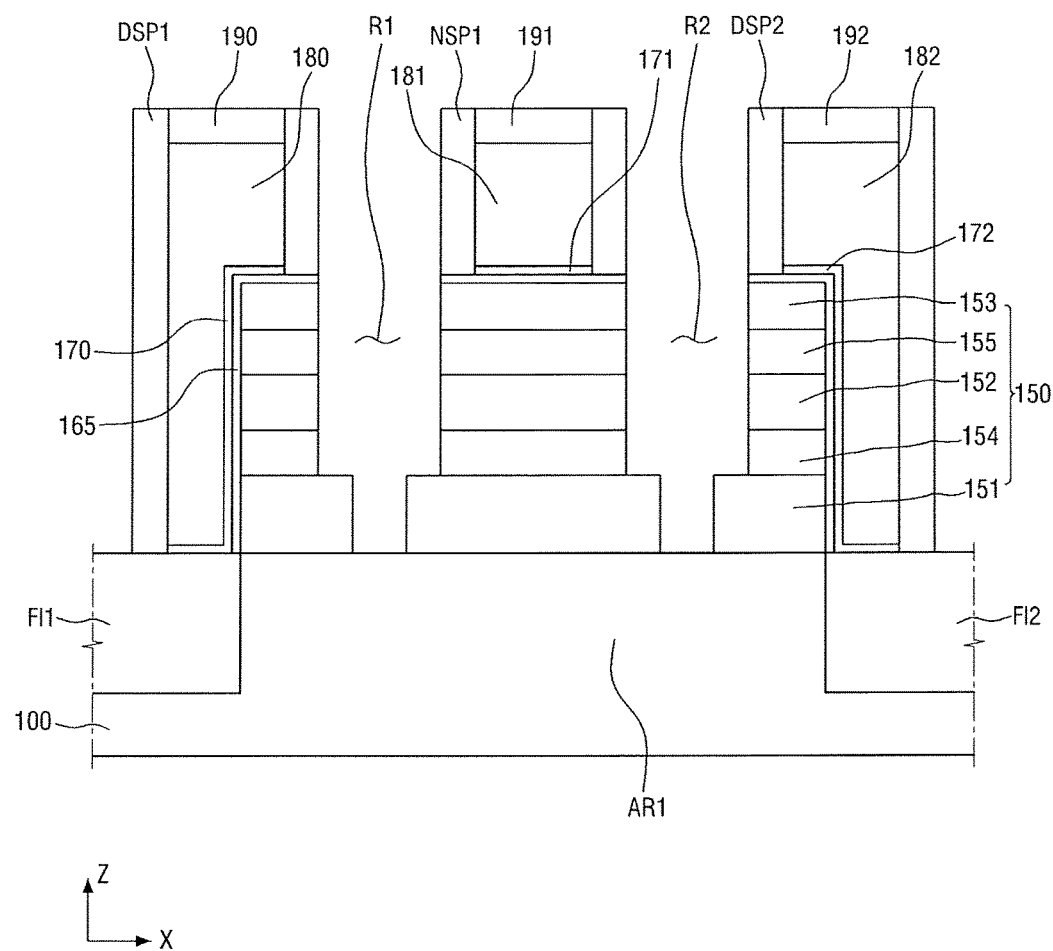

Referring to FIG. 19, the first inner spacer ESP1 and the second and third inner spacers ESP2 and ESP3 are removed, thereby forming a structure in which the first sacrificial layer 151 contacting the first active region AR1 protrudes toward the first and second recesses R1 and R2.

Figure 20:
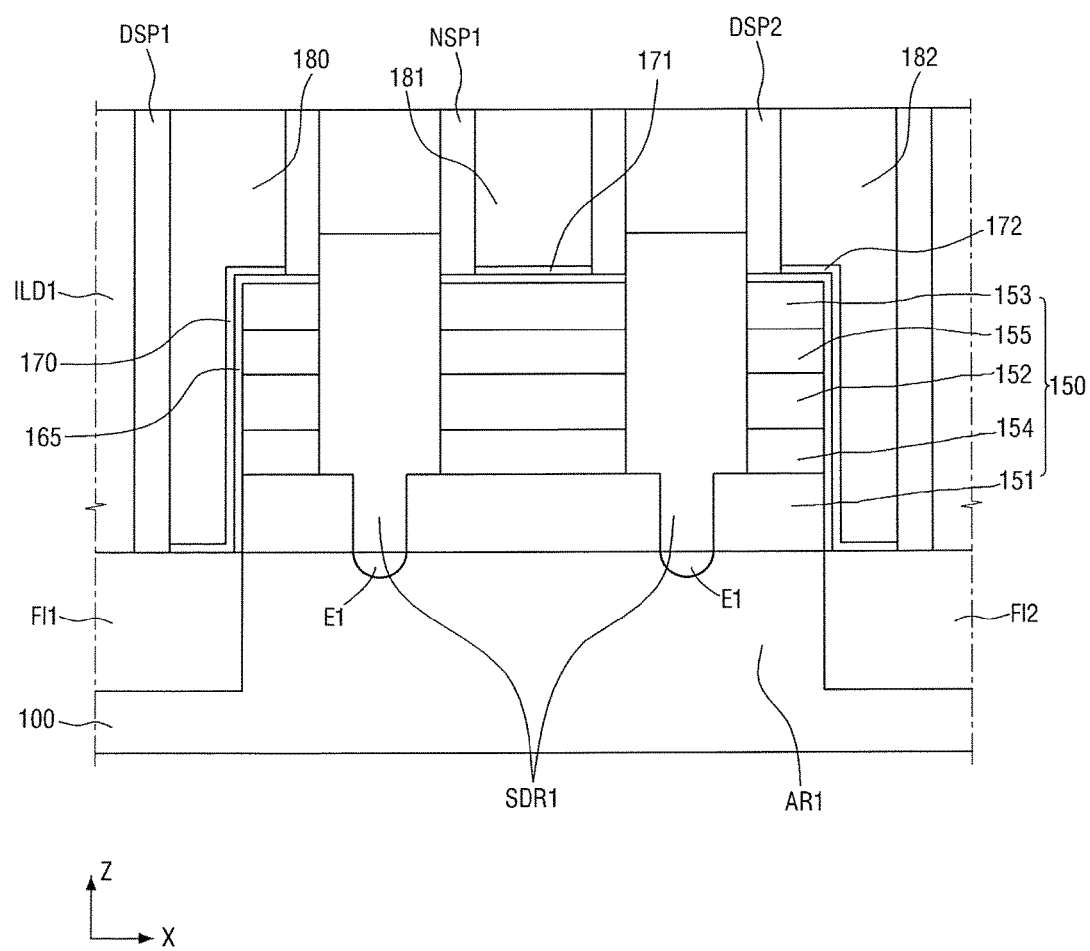

Referring to FIG. 20, the first source or drain impurity layer E1 is formed in the area in which the first active region AR1 is exposed to the first and second recesses R1 and R2. Subsequently, the first source or drain epitaxial layer SDR1 is formed to fill the first and second recesses R1 and R2. That is, the first source or drain epitaxial layer SDR1 may be formed on the first source or drain impurity layer E1.

The first source or drain epitaxial layer SDR1 may be formed by an epitaxial growth process. The first sacrificial layer 151 left in the aforementioned process of forming the first and second recesses R1 and R2 described with reference to FIG. 16 may act as an epitaxial seed layer. Thus, the first source or drain epitaxial layer SDR1 may grow using the epitaxial seed layer, the second and third sacrificial layers 152 and 153 exposed through side surfaces of the first and second recesses R1 and R2, and the first and second semiconductor layers 154 and 155 as a seed layer. In an exemplary embodiment in which the epitaxial seed layer does not exist, the first source or drain epitaxial layer SDR1 may grow using the first to third sacrificial layers 151, 152 and 153 and the first and second semiconductor layers 154 and 155 exposed through the side surfaces of the first and second recesses R1 and R2 as a seed layer.

Thus, the first source or drain epitaxial layer SDR1 may contact the first to third sacrificial layers 151, 152 and 153 and the first and second semiconductor layers 154 and 155.

After forming the first source or drain epitaxial layer SDR1, the first interlayer insulating layer ILD1 that covers the first source or drain epitaxial layer SDR1, the sacrificial gates 180, 181 and 182, the first gate spacer NSP1, the first and second dummy gate spacers DSP1 and DSP2, etc., is formed on the substrate 100.

The first interlayer insulating layer ILD1 may include at least one of a low dielectric constant material, an oxide layer, a nitride layer and an oxynitride layer. The low dielectric constant material may be formed of, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. However, exemplary embodiments of the present inventive concept are not limited thereto.

Subsequently, the first interlayer insulating layer ILD1 is planarized until the sacrificial gates 180, 181 and 182 are exposed. As a result, the second mask patterns 190, 191 and 192 are removed, thereby exposing upper surfaces of the sacrificial gates 180, 181 and 182.

Figure 21:
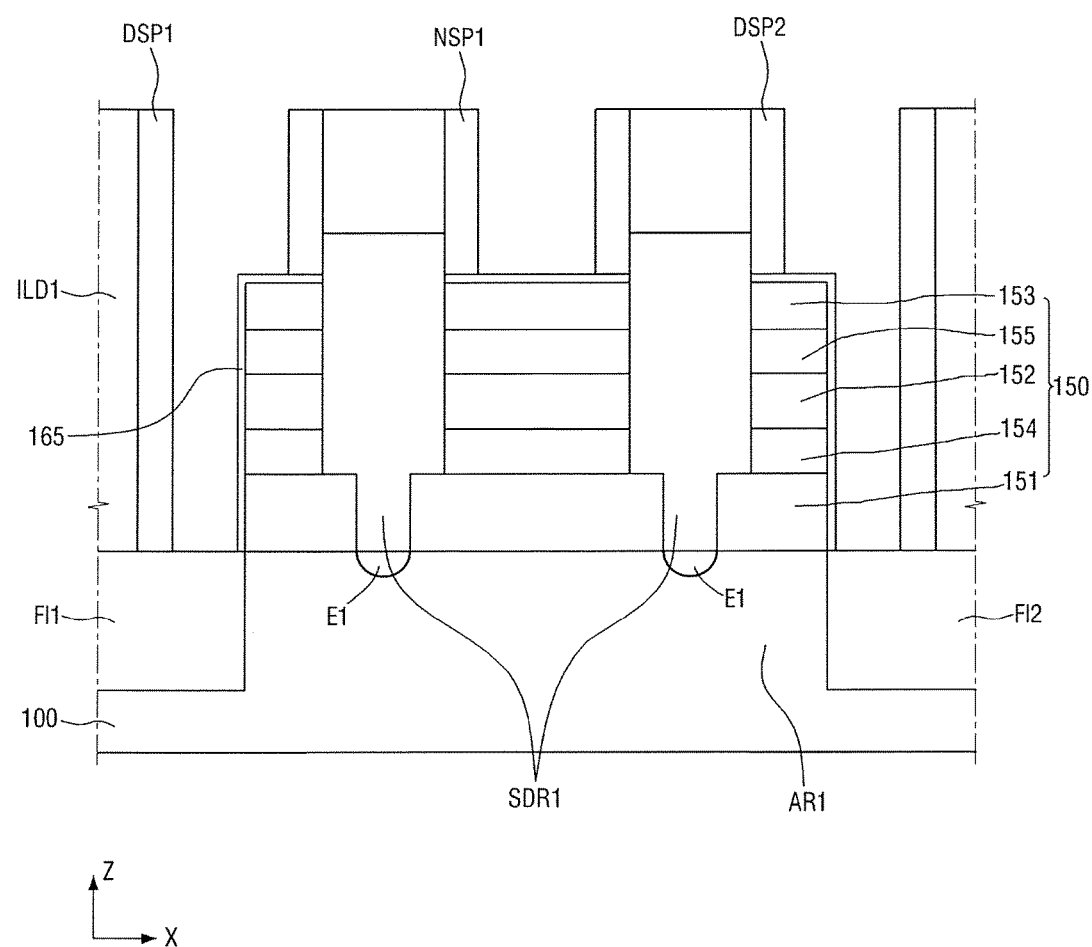

Referring to FIG. 21, the exposed sacrificial gates 180, 181 and 182 may be removed. In addition, the gate insulating layers 170, 171 and 172 may also be removed. That is, in an exemplary embodiment, the sacrificial gates 180, 181 and 182 and the gate insulating layers 170, 171 and 172 may be sequentially removed.

The removal process of FIG. 21 may include forming a third mask pattern for exposing upper surfaces of the sacrificial gates 180, 181 and 182, and performing an etching process using the third mask pattern as a mask.

Figure 22:
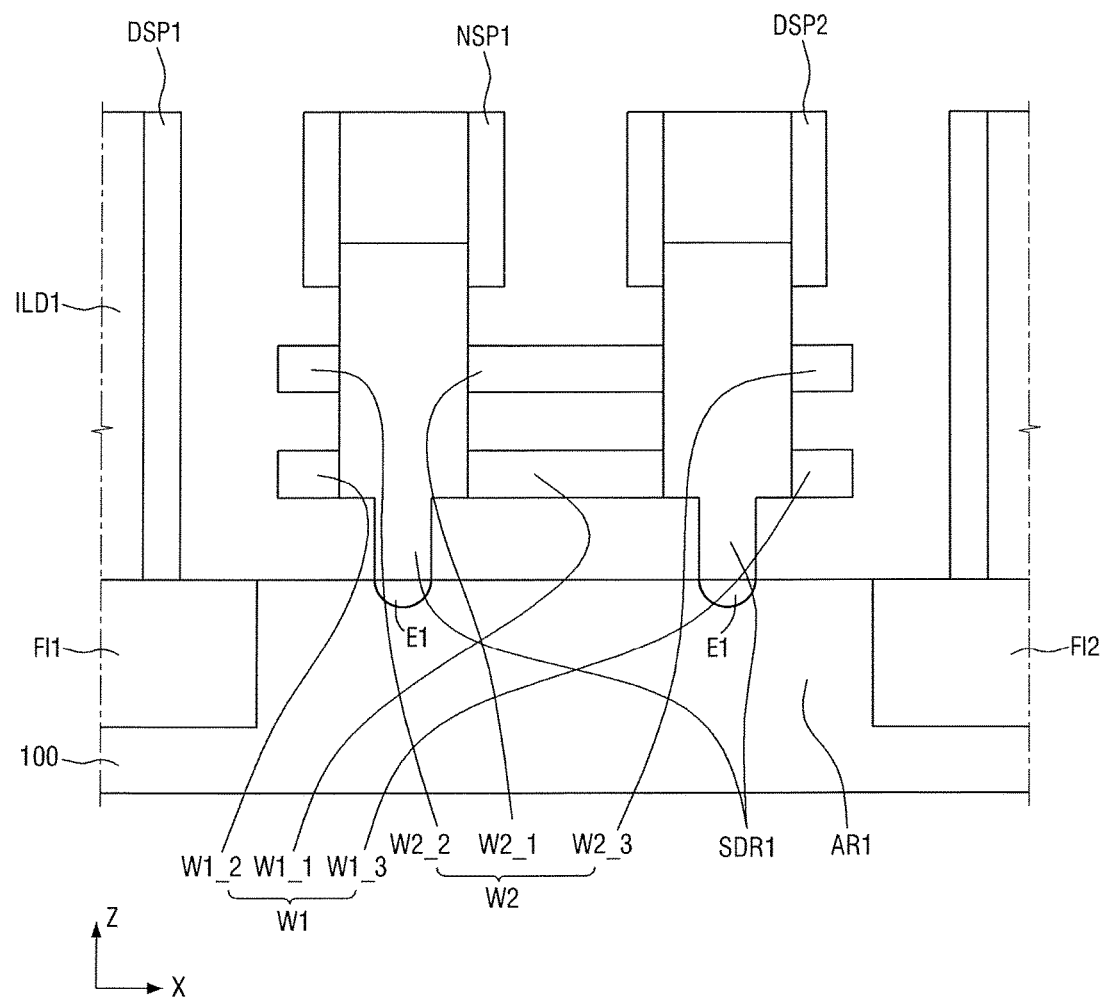

Referring to FIG. 22, the insulating layer 165 is removed using a first etchant in which the etching rate for the insulating layer 165 is higher than the etching rate for the first to third sacrificial layers 151, 152 and 153 and the first and second semiconductor layers 154 and 155.

For example, in an exemplary embodiment in which the insulation layer 165 is $SiO_2$, the first etchant may include hydrofluoric acid (HF), and the first etchant may selectively remove only the insulation layer 165.

Subsequently, the first to third sacrificial layers 151, 152 and 153 may be removed using a second etchant in which the etching rate for the first to third sacrificial layers 151, 152 and 153 is higher than the etching rate for the first and second semiconductor layers 154 and 155. It is to be understood that methods for removing the first to third sacrificial layers 151, 152 and 153 are not limited thereto, and the first to third sacrificial layers 151, 152 and 153 can be removed through, for example, an isotropic dry etching process.

Through the above-described processes, the first nanowire pattern W1 formed of the first semiconductor layer 154 and the second nanowire pattern W2 formed of the second semiconductor layer 155 are formed on the first active region AR1. That is, one or more nanowire patterns may be formed on the first active region AR1.

In addition, the first to third sacrificial layers 151, 152 and 153 are removed, thereby forming a space. Furthermore, the first source or drain epitaxial layer SDR1 may be exposed through the space.

Figure 23:
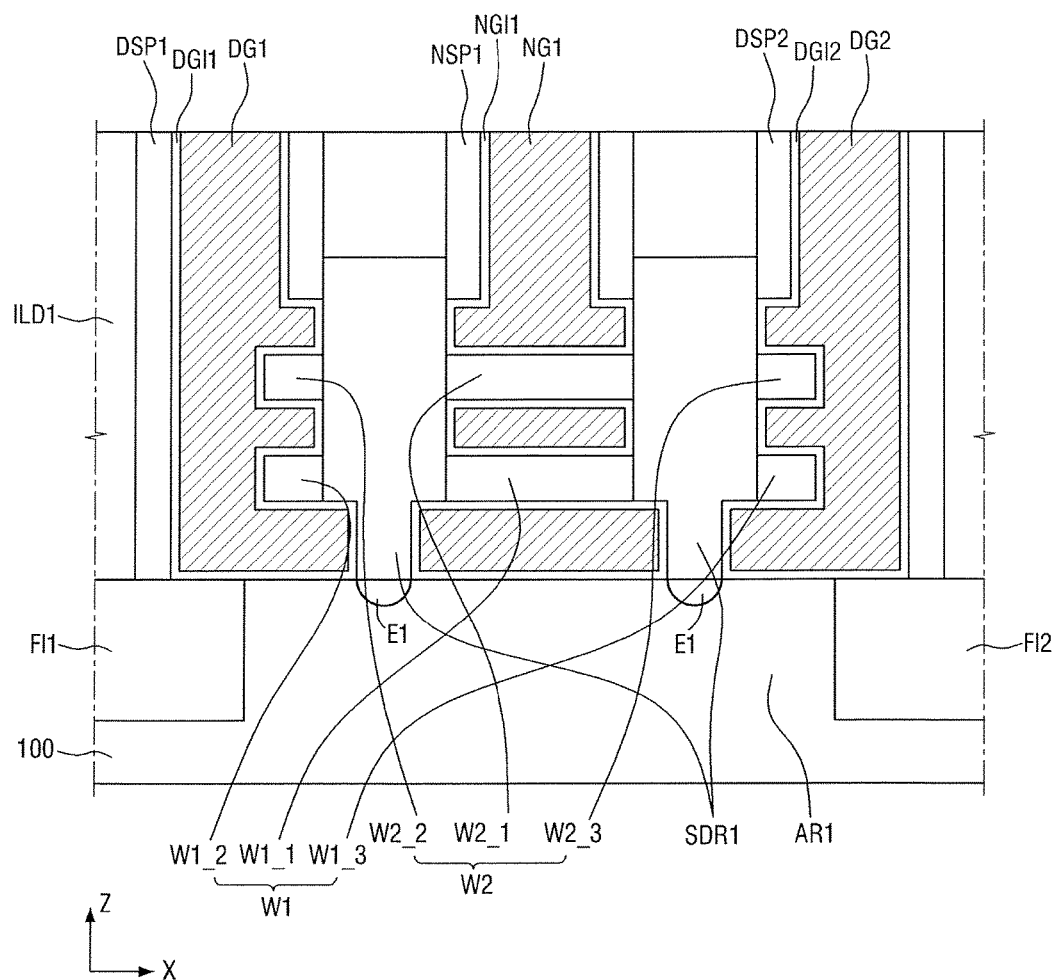

Referring to FIG. 23, the first gate insulating layer NGI1 is formed along the perimeters of the first and second nanowire patterns W1 and W2, sidewalls of the first gate spacer NSP1, and the exposed first source or drain epitaxial layer SDR1.

Furthermore, the first dummy gate insulating layer DGI1 is formed along the perimeter of one end of each of the first and second nanowire patterns W1 and W2, sidewalls of the first dummy gate spacer DSP1, and the exposed first source or drain epitaxial layer SDR1. The second dummy gate insulating layer DGI2 is formed along the perimeter of the other end of each of the first and second nanowire patterns W1 and W2, sidewalls of the second dummy gate spacer DSP2, and the exposed first source or drain epitaxial layer SDR1.

As a result, the exposed part of the first source or drain epitaxial layer SDR1 is permitted to contact the first gate insulating layer NGI1 and the first and second dummy gate insulating layers DGI1 and DGI2.

Subsequently, the first gate NG1, which covers (e.g., entirely covers) the perimeter of the first nanowire pattern W1 and the perimeter of the second nanowire pattern W2, is formed on the first gate insulating layer NGI1.

Furthermore, the first dummy gate DG1, which covers (e.g., entirely covers) the perimeter of one end of each of the first and second nanowire patterns W1 and W2 and the end surface of one end of each of the first and second nanowire patterns W1 and W2, is formed on the first dummy gate insulating layer DGI1.

The second dummy gate DG2, which covers (e.g., entirely covers) the perimeter of the other end of each of the first and second nanowire patterns W1 and W2 and the end surface of the other end of each of the first and second nanowire patterns W1 and W2, is formed on the second dummy gate insulating layer DGI2.

In addition, a planarization process for forming the first gate NG1, the first and second dummy gates DG1 and DG2, the first gate insulating layer NGI1, and the first and second dummy gate insulating layers DGI1 and DGI2 may be performed.

Figure 24:
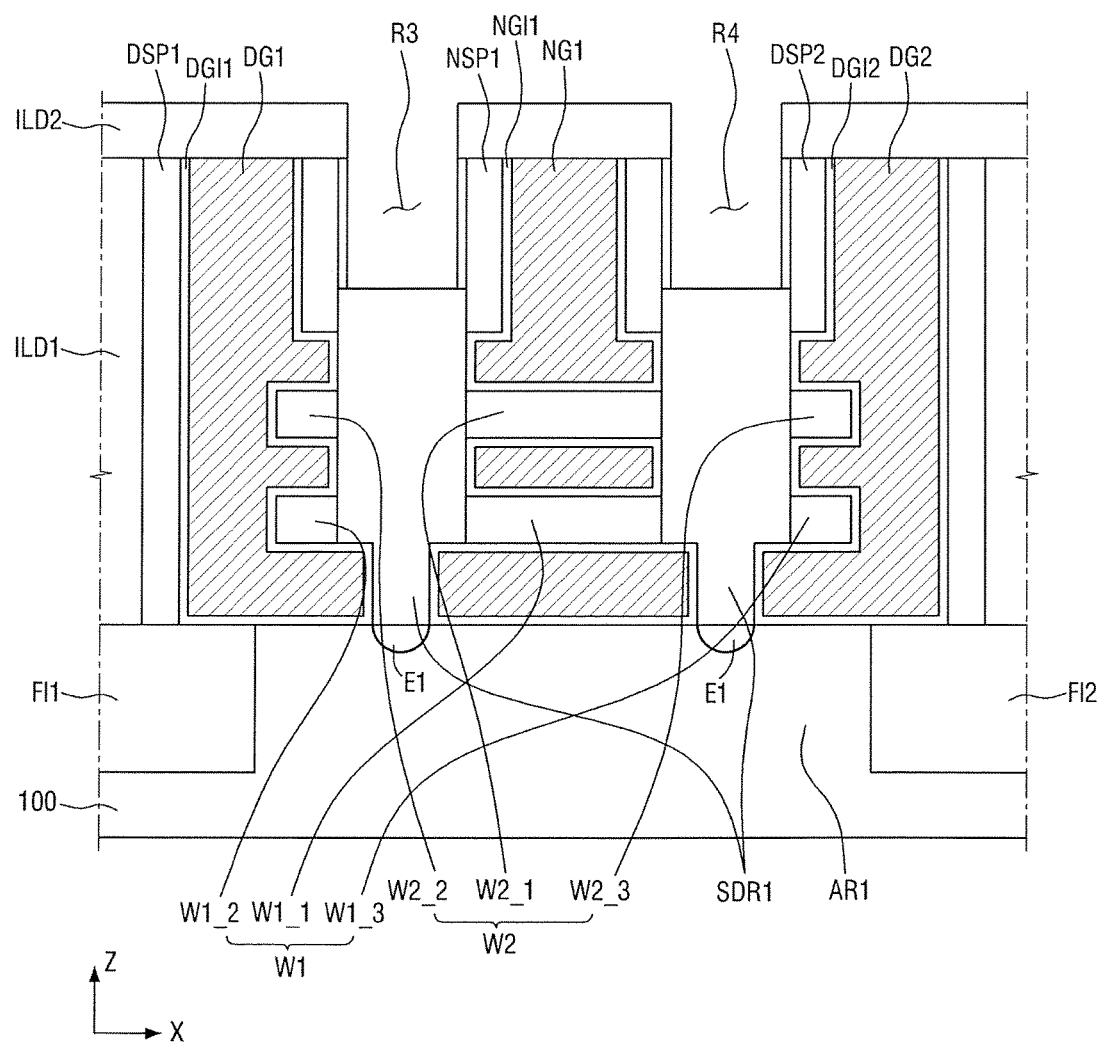

Referring to FIG. 24, the second interlayer insulating layer ILD2 may be formed to cover the first interlayer insulating layer ILD1, the first gate NG1, the first and second dummy gates DG1 and DG2, the first gate spacer NSP1, the first and second dummy gate spacers DSP1 and DSP2, etc.

After forming the second interlayer insulating layer ILD2, a fourth mask pattern is formed on the second interlayer insulating layer ILD2, and third and fourth recesses R3 and R4 may be formed using the fourth mask pattern as a mask.

In this case, the second interlayer insulating layer ILD2 may include, for example, at least one of a low dielectric constant material, an oxide layer, a nitride layer and an oxynitride layer. However, exemplary embodiments of the present inventive concept are not limited thereto.

Figure 25:
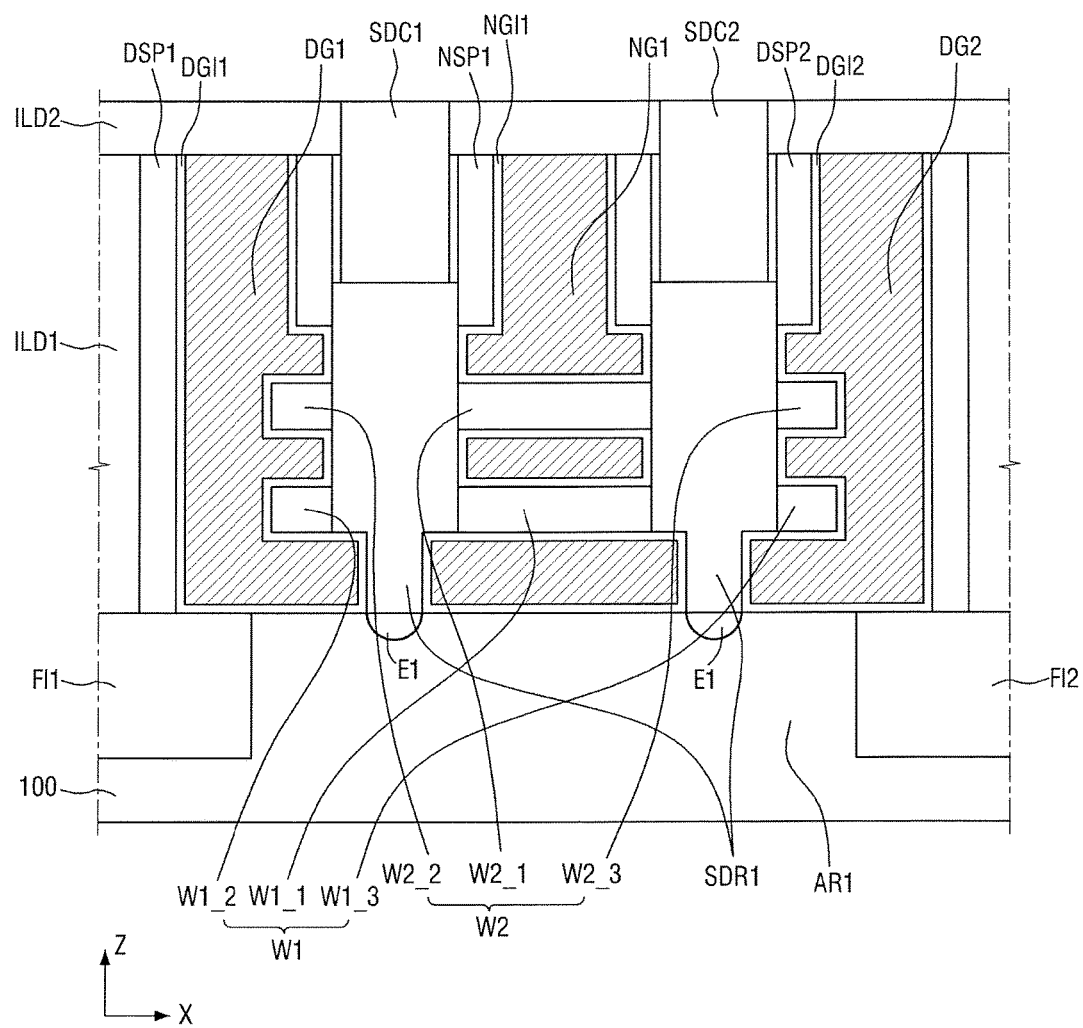

Referring to FIG. 25, first and second source or drain contacts SDC1 and SDC2 may be formed to fill the third and fourth recesses R3 and R4.

The first and second source or drain contacts SDC1 and SDC2 are formed, thereby forming the semiconductor device 1 according to an exemplary embodiment of the present inventive concept as shown in FIG. 2. In a similar manner, third and fourth drain contacts SDC3 and SDC4 may be formed with reference to the semiconductor device 3 according to an exemplary embodiment of the inventive concept as shown in FIG. 6.

It is to be understood that the method of fabricating the semiconductor device 1 of FIG. 2 described with reference to FIGS. 12 to 25 may be used to fabricate additional semiconductor devices described herein according to exemplary embodiments of the present inventive concept.

Hereinafter, the semiconductor device 2 of FIG. 4 will be described with reference to FIGS. 26 to 28. Since a fabrication process substantially similar to the fabrication process described with reference to FIGS. 12 to 25 may be applied to the semiconductor device 2 of FIG. 4, a further description of processes previously described may be omitted herein.

Figure 26:
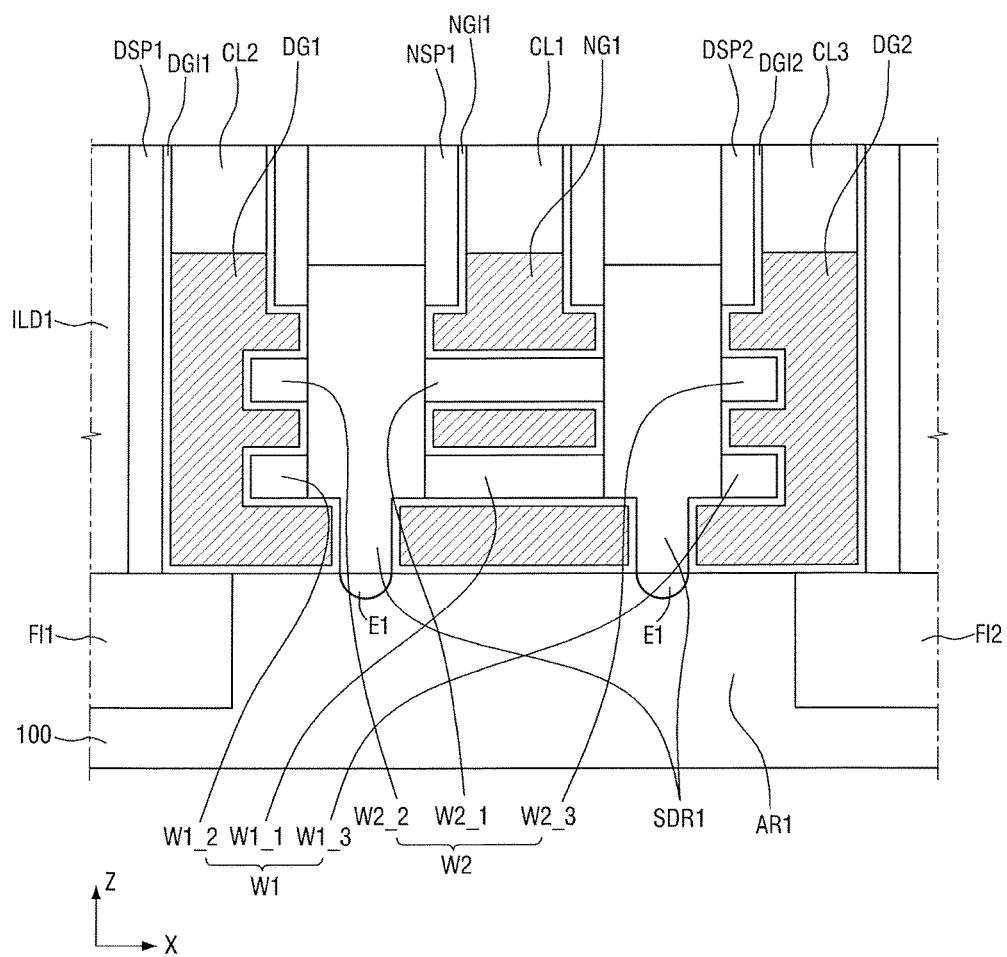
FIGS. 26 to 28 are diagrams illustrating a method of fabricating the semiconductor device of FIG. 4 according to an exemplary embodiment of the present inventive concept.
Figure 27:
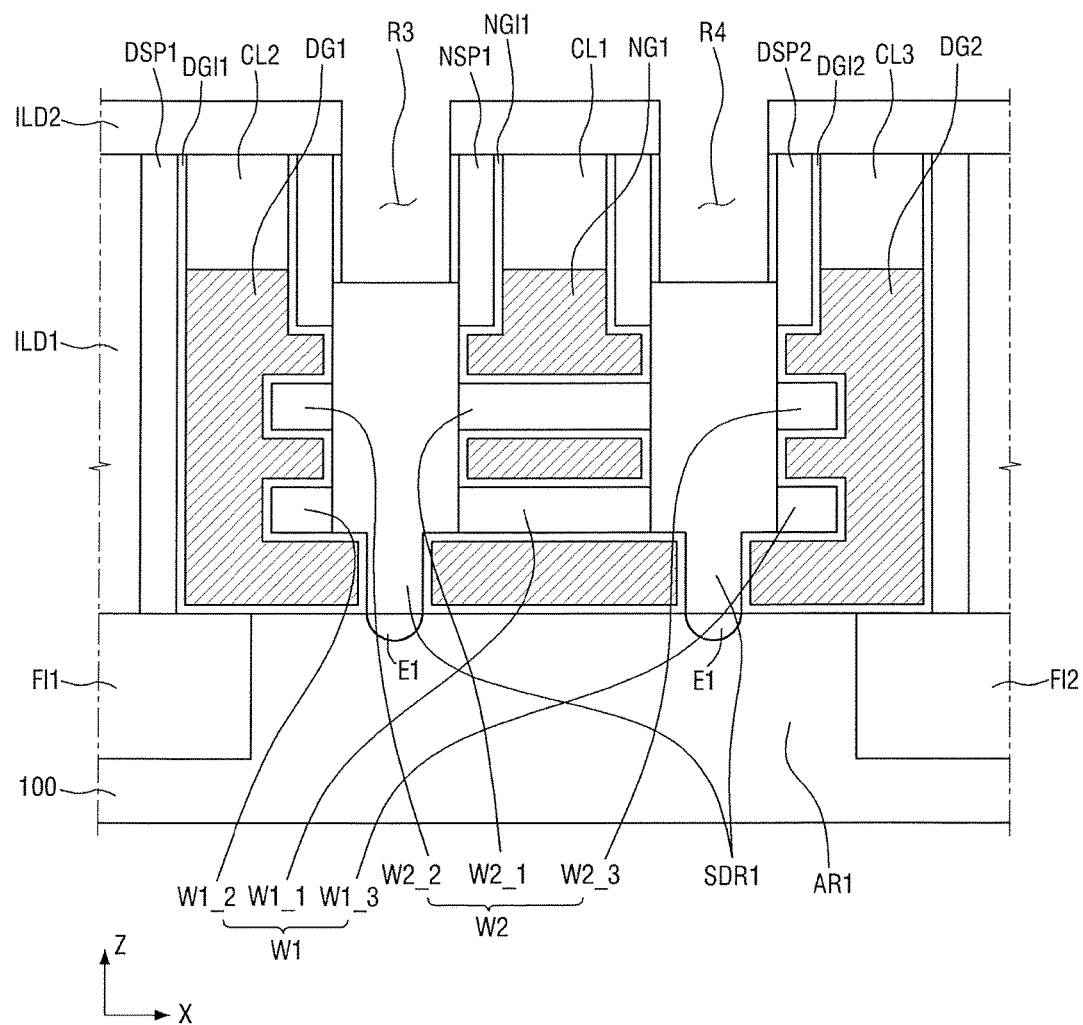
Figure 28:
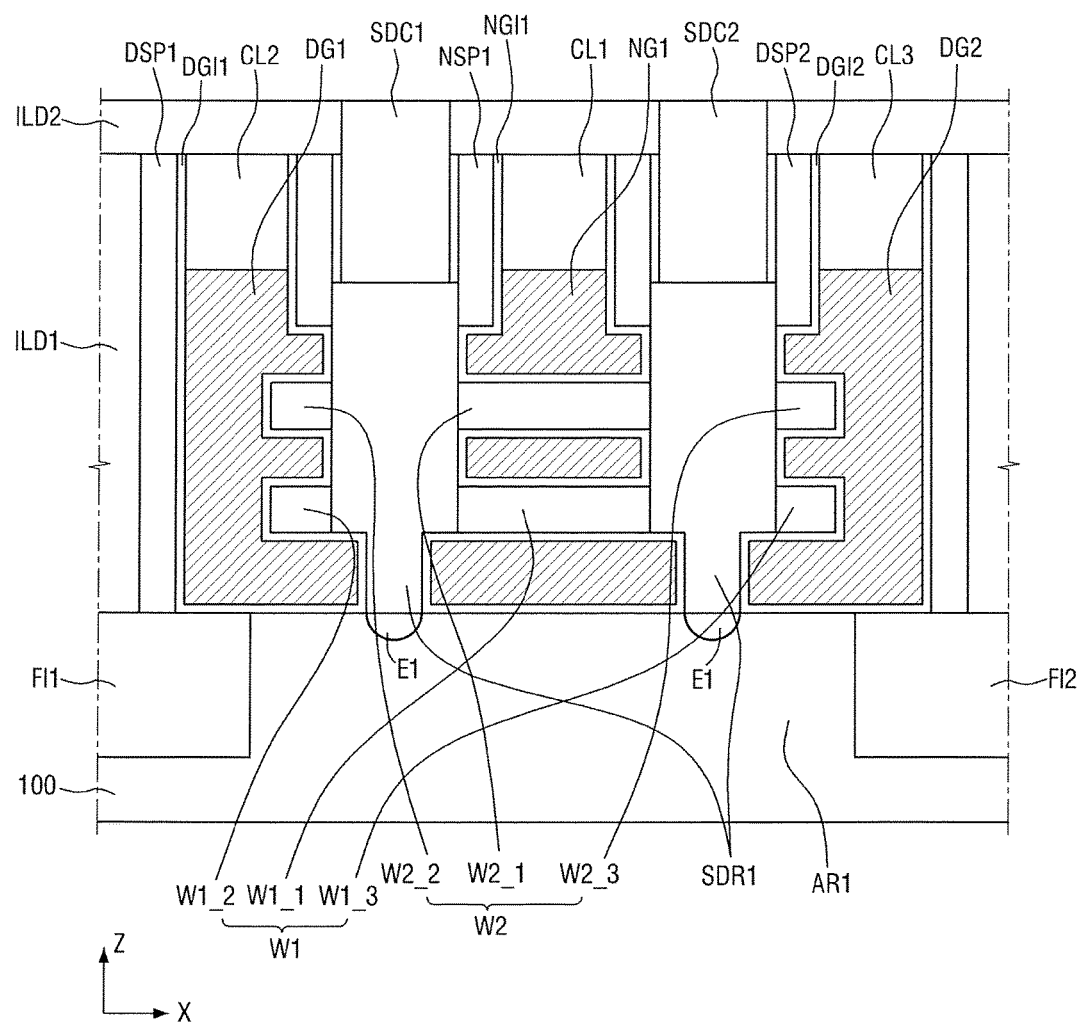

FIGS. 26 to 28 are diagrams illustrating a method of fabricating the semiconductor device of FIG. 4 according to an exemplary embodiment of the inventive concept.

Referring first to FIG. 26, an upper part of each of the first gate NG1 and the first and second dummy gates DG1 and DG2 is partially removed, and a capping layer is formed to cover the first interlayer insulating layer ILD1, the first gate NG1, the first and second dummy gates DG1 and DG2, etc.

After forming the capping layer, the capping layer is planarized until the upper surface of the first interlayer insulating layer ILD1 is exposed, thereby forming the first to third capping layers CL1 to CL3 shown in FIG. 26.

In this case, the first to third capping layers CL1 to CL3 may include, for example, a material having an etching selectivity different from the first interlayer insulating layer ILD1. For example, the first to third capping layers CL1 to CL3 may include SiN. However, exemplary embodiments of the present inventive concept are not limited thereto. The first interlayer insulating layer ILD1 may include, for example, a low dielectric constant material or an oxide layer.

Referring to FIG. 27, the second interlayer insulating layer ILD2 may be formed to cover the first interlayer insulating layer ILD1, the first gate NG1, the first and second dummy gates DG1 and DG2, the first gate spacer NSP1, the first and second dummy gate spacers DSP1 and DSP2, the first to third capping layers CL1 to CL3, etc.

After forming the second interlayer insulating layer ILD2, the fourth mask pattern is formed on the second interlayer insulating layer ILD2, and third and fourth recesses R3 and R4 may be formed using the fourth mask pattern as a mask.

In this case, the second interlayer insulating layer ILD2 may include, for example, at least either a low dielectric constant material or an oxide layer. However, exemplary embodiments of the present inventive concept are not limited thereto.

Referring to FIG. 28, the first and second source or drain contacts SDC1 and SDC2 may be formed to fill the third and fourth recesses R3 and R4.

The first and second source or drain contacts SDC1 and SDC2 are formed, thereby forming the semiconductor device 2 according to an exemplary embodiment of the present inventive concept, as shown in FIG. 4.

Figure 29:
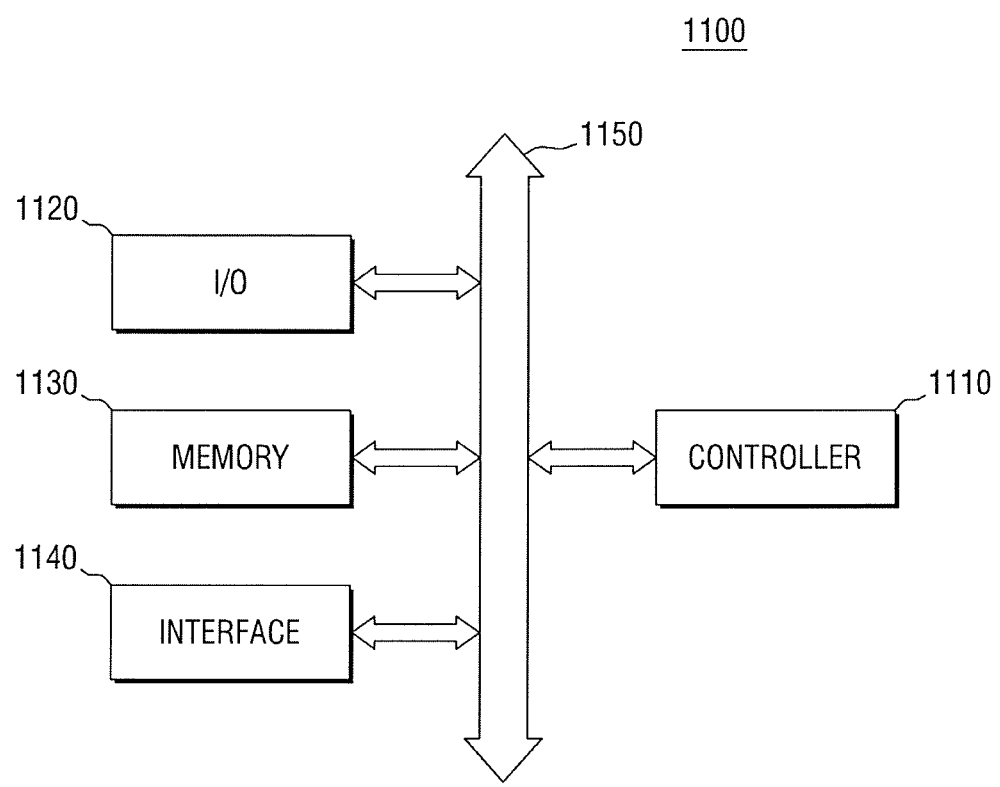
FIG. 29 is a block diagram illustrating an electronic system including semiconductor devices according to exemplary embodiments of the present inventive concept.

FIG. 29 is a block diagram illustrating an electronic system including semiconductor devices according to exemplary embodiments of the present inventive concept.

Referring to FIG. 29, an electronic system 1100 according to exemplary embodiments of the present inventive concept may include a controller 1110, an input/output (I/O) device 1120, a memory device 1130, an interface 1140 and a bus 1150. The controller 1110, the input/output device 1120, the memory device 1130 and/or the interface 1140 may be coupled with each other through the bus 1150. The bus 1150 may serve as a path for data communication.

The controller 1110 may include at least one of, for example, a microprocessor, a digital signal processor, a microcontroller, and logic elements capable of performing functions similar to those of the microprocessor, the digital signal processor, and the microcontroller. The input/output device 1120 may include, for example, a keypad, a keyboard, a display device, a touchscreen, etc. The memory device 1130 may store data and/or instructions therein. The interface 1140 may perform the function of transmitting data to a communication network or receiving data from the communication network. The interface 1140 may be a wired interface or a wireless interface. For example, the interface 1140 may include an antenna, a wired/wireless transceiver, etc. The electronic system 1100 may further include memory such as, for example, high speed DRAM and/or SRAM that functions as an operation memory, thereby improving operation of the controller 1110. The semiconductor devices according to exemplary embodiments of the present inventive concept as described herein may be provided within the memory device 1130, as a part of the controller 1110, as a part of the input/output device 1120, etc.

The electronic system 1100 may be implemented as, for example, a personal digital assistant (PDA), a portable computer, a web tablet, a wireless phone, a mobile phone, a digital music player, a memory card, a smartphone, or any other electronic device capable of transmitting and/or receiving data (e.g., in a wired or a wireless environment).

Figure 30:
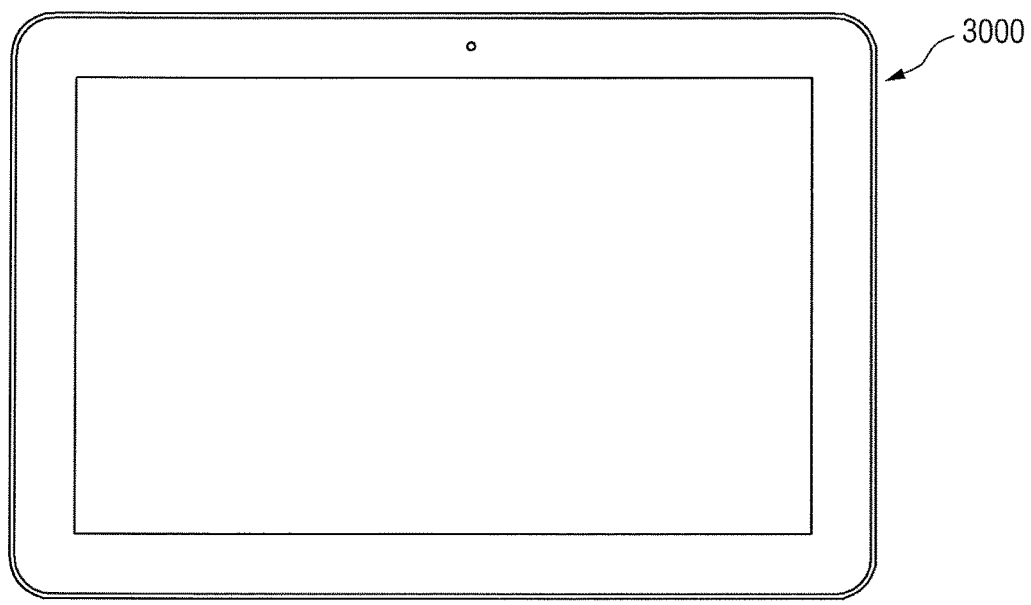
FIGS. 30 and 31 are diagrams illustrating examples of a semiconductor system in which semiconductor devices according to exemplary embodiments of the present inventive concept can be applied.
Figure 31:
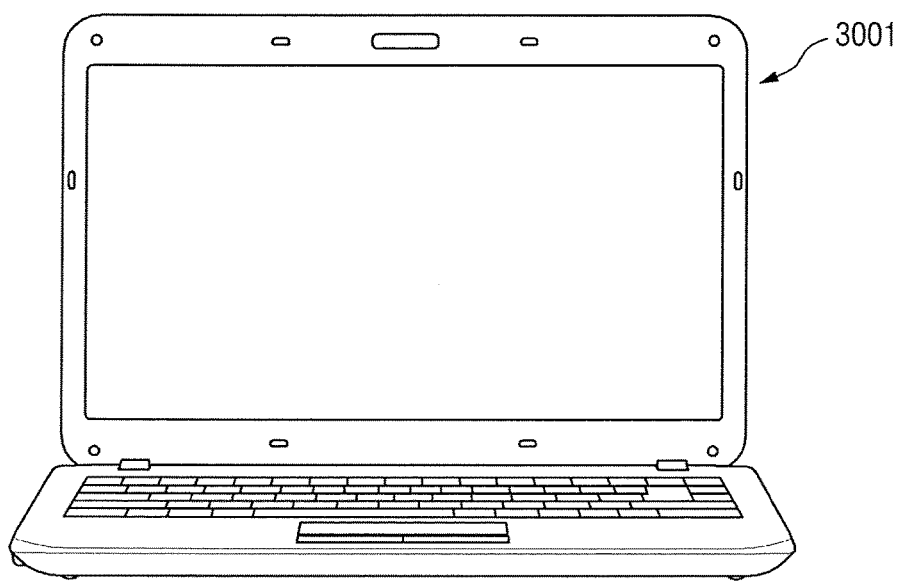

FIGS. 30 and 31 are diagrams illustrating examples of a semiconductor system in which semiconductor devices according to exemplary embodiments of the present inventive concept can be applied. FIG. 30 illustrates a tablet PC 3000, and FIG. 31 illustrates a notebook computer 3001. At least one of the semiconductor devices according to exemplary embodiments of the present inventive concept can be used in the tablet PC 3000 and the notebook computer 3001. In addition, the semiconductor devices according to exemplary embodiments of the present inventive concept can be also utilized in other integrated circuit devices.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
a first active region;
a field insulating layer disposed in the first active region;
a first nanowire pattern disposed on the first active region and extended in a first direction, wherein the first nanowire pattern comprises a first part, a second part, and a third part spaced apart from one another in the first direction;
a first gate disposed on the first active region and extended in a second direction crossing the first direction, wherein the first gate entirely covers the first part of the first nanowire pattern; and
a source or drain epitaxial layer disposed on at least one side of the first nanowire pattern,
wherein the first gate comprises a first region disposed on the first nanowire pattern and having a first width, and a second region disposed beneath the first nanowire pattern and having a second width wider than the first width.

2. The semiconductor device of claim 1, further comprising:
a second nanowire pattern disposed on the first nanowire pattern and extended in the first direction,
wherein the second region of the first gate is disposed between the first nanowire pattern and the first active region.

3. The semiconductor device of claim 2, further comprising:
a source or drain impurity layer disposed in the first active region, wherein the source or drain impurity layer is not overlapped with the second region of the first gate.

4. The semiconductor device of claim 1, further comprising:
a first dummy gate overlapped with the field insulating layer and the first active region and spaced apart from the first gate in the first direction,
wherein a width of a region in which the first active region and the first dummy gate are overlapped with each other is wider than a width of a region in which the second part of the first nanowire pattern and the first dummy gate are overlapped with each other.

5. The semiconductor device of claim 1, further comprising:
a second active region spaced apart from the first active region;
a second nanowire pattern disposed on the second active region and extended in the first direction, wherein the second nanowire pattern comprises a first part, a second part, and a third part spaced apart from one another in the first direction; and
a second gate disposed on the second active region and extended in the second direction, wherein the second gate entirely covers the first part of the second nanowire pattern,
wherein the second gate comprises a third region disposed on the first part of the second nanowire pattern and having the first width, and a fourth region disposed beneath the first part of the second nanowire pattern and having a third width wider than the first width and different from the second width.

6. The semiconductor device of claim 5, further comprising:
a third nanowire pattern disposed on the second nanowire pattern and extended in the first direction, wherein the fourth region of the second gate is disposed between the second nanowire pattern and the second active region.

7. The semiconductor device of claim 1, further comprising:
a second active region spaced apart from the first active region;
a second nanowire pattern disposed on the second active region and extended in the first direction, wherein the second nanowire pattern comprises a first part, a second part, and a third part spaced apart from one another in the first direction; and
a second gate disposed on the second active region and extended in the second direction, wherein the second gate entirely covers the first part of the second nanowire pattern and is disposed on the first part of the second nanowire pattern and beneath the first part of the second nanowire pattern,
wherein a width of the second gate disposed on the first part of the second nanowire pattern and a width of the second gate disposed beneath the first part of the second nanowire pattern are substantially the same as each other.

8. A semiconductor device, comprising:
a first active region;
a field insulating layer disposed in the first active region;
a first nanowire pattern disposed on the first active region and extended in a first direction, wherein the first nanowire pattern comprises a first part, a second part, and a third part spaced apart from one another in the first direction;
a first gate disposed on the first active region and extended in a second direction crossing the first direction, wherein the first gate entirely covers the first part of the first nanowire pattern;
a first source or drain impurity layer disposed in the first active region; and
a first source or drain epitaxial layer disposed on at least one side of the first part of the first nanowire pattern, wherein the first source or drain epitaxial layer comprises an upper region having a first width and a lower region having a second width narrower than the first width.

9. The semiconductor device of claim 8, wherein the first source or drain epitaxial layer contacts the first source or drain impurity layer.

10. The semiconductor device of claim 8, wherein a width of a region in which the first active region and the first gate are overlapped with each other is wider than a width of a region in which the first part of the first nanowire pattern and the first gate are overlapped with each other.

11. The semiconductor device of claim 10, further comprising:
a first dummy gate overlapped with the field insulating layer and the first active region and spaced apart from the first gate in the first direction,
wherein a width of a region in which the first active region and the first dummy gate are overlapped with each other is wider than a width of a region in which the second art of the first nanowire pattern and the first dummy gate are overlapped with each other.

12. The semiconductor device of claim 8, further comprising:
a second active region spaced apart from the first active region;
a second nanowire pattern disposed on the second active region and extended in the first direction, wherein the second nanowire pattern comprises a first part, a second part, and a third part spaced apart from one another in the first direction;
a second gate disposed on the second active region and extended in the second direction, wherein the second gate entirely covers the first part of the second nanowire pattern; and
a plurality of second source or drain impurity layers disposed in the second active region,
wherein the first source or drain impurity layer is one of a plurality of first source or drain impurity layers disposed in the first active region, and a distance between the first source or drain impurity layers is different from a distance between the second source or drain impurity layers.

13. The semiconductor device of claim 8, further comprising:
a second active region spaced apart from the first active region;
a second nanowire pattern disposed on the second active region and extended in the first direction, wherein the second nanowire pattern comprises a first part, a second part, and a third part spaced apart from one another in the first direction;
a second gate disposed on the second active region and extended in the second direction, wherein the second gate entirely covers the first part of the second nanowire pattern;
a second source or drain impurity layer disposed in the second active region; and
a second source or drain epitaxial layer disposed on at least one side of the first part of the second nanowire pattern,
wherein the second source or drain epitaxial layer comprises a lower region having a third width narrower than the first width and different from the second width.

14. The semiconductor device of claim 13, wherein a width of an upper region of the second source or drain epitaxial layer and a width of the lower region of the second source or drain epitaxial layer are substantially the same as each other.

15. The semiconductor device of claim 13, wherein the second source or drain epitaxial layer comprises an upper region having the first width.

16. A semiconductor device, comprising:
a first active region;
a field insulating layer disposed in the first active region;
a first nanowire pattern disposed on and spaced apart from the first active region and extended in a first direction, wherein the first nanowire pattern comprises a first part, a second part, and a third part spaced apart from one another in the first direction;
a second nanowire pattern disposed on and spaced apart from the first active region, spaced apart from the first nanowire pattern, and extended in the first direction, wherein the second nanowire pattern comprises a first part, a second part, and a third part spaced apart from one another in the first direction;
a first gate disposed on the first active region and extended in a second direction crossing the first direction, wherein the first gate entirely surrounds a cross-sectional perimeter of the first part of the first and second nanowire patterns; and
a source or drain epitaxial layer disposed on at least one side of the first part of the first and second nanowire patterns, wherein the first gate comprises a first region disposed on the first part of the first nanowire pattern and having a first width in the first direction, and a second region disposed beneath the first part of the first nanowire pattern and having a second width in the first direction wider than the first width.

17. The semiconductor device of claim 16, wherein the second region of the first gate is disposed between the first nanowire pattern and the first active region.

18. The semiconductor device of claim 17, further comprising:
a source or drain impurity layer disposed in the first active region, wherein the source or drain impurity layer is not overlapped with the second region of the first gate.

19. The semiconductor device of claim 16, further comprising:
a first dummy gate overlapped with the field insulating layer and the first active region and spaced apart from the first gate in the first direction,
wherein a width of a region in which the first active region and the first dummy gate are overlapped with each other is wider than a width of a region in which the second part of the first nanowire pattern and the first dummy gate are overlapped with each other.

20. The semiconductor device of claim 16, further comprising:
a second active region spaced apart from the first active region in the first direction;
a third nanowire pattern disposed on and spaced apart from the second active region and extended in the first direction, wherein the third nanowire pattern comprises a first part, a second part, and a third part spaced apart from one another in the first direction;
a fourth nanowire pattern disposed on and spaced apart from the second active region, spaced apart from the third nanowire pattern, and extended in the first direction, wherein the fourth nanowire pattern comprises a first part, a second part, and a third part spaced apart from one another in the first direction; and
a second gate disposed on the second active region and extended in the second direction, wherein the second gate entirely surrounds a cross-sectional perimeter of the first part of the third and fourth nanowire patterns.

\* \* \* \* \*